(12) United States Patent
Lung

(10) Patent No.: US 9,018,692 B2
(45) Date of Patent: Apr. 28, 2015

(54) LOW COST SCALABLE 3D MEMORY

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 146 days.

(21) Appl. No.: 13/070,323

(22) Filed: Mar. 23, 2011

(65) Prior Publication Data
US 2012/0181599 A1    Jul. 19, 2012

Related U.S. Application Data

(60) Provisional application No. 61/434,424, filed on Jan. 19, 2011.

(51) Int. Cl.
| H01L 29/72 | (2006.01) |
| H01L 27/115 | (2006.01) |
| H01L 29/792 | (2006.01) |

(52) U.S. Cl.
CPC .... H01L 27/11578 (2013.01); H01L 27/11582 (2013.01); H01L 29/792 (2013.01)

(58) Field of Classification Search
USPC ........................ 257/390, 321, E29.61; 365/51
See application file for complete search history.

(56) References Cited

U.S. PATENT DOCUMENTS

| 6,653,712 B2 * | 11/2003 | Knall et al. ................... 257/530 |
| 6,737,675 B2 * | 5/2004 | Patel et al. ........................ 257/67 |
| 6,770,939 B2 | 8/2004 | Subramanian et al. |
| 6,849,905 B2 * | 2/2005 | Ilkbahar et al. ................. 257/390 |
| 6,858,899 B2 * | 2/2005 | Walker et al. ................... 257/347 |
| 7,473,589 B2 | 1/2009 | Lai et al. |
| 7,663,900 B2 * | 2/2010 | Stipe ................................. 365/51 |
| 7,709,334 B2 * | 5/2010 | Lai et al. ........................ 438/287 |
| 7,977,735 B2 * | 7/2011 | Lai et al. ........................ 257/324 |
| 7,983,065 B2 * | 7/2011 | Samachisa ....................... 365/51 |
| 8,134,139 B2 | 3/2012 | Lin et al. |
| 8,236,623 B2 | 8/2012 | Schricker et al. |
| 8,279,656 B2 | 10/2012 | Chien et al. |
| 2004/0119122 A1 * | 6/2004 | Ilkbahar et al. ................ 257/390 |
| 2005/0230724 A1 | 10/2005 | Hsu |
| 2007/0132049 A1 * | 6/2007 | Stipe .............................. 257/421 |
| 2010/0059808 A1 * | 3/2010 | Zheng et al. ................... 257/321 |

(Continued)

FOREIGN PATENT DOCUMENTS

CN    101477987 A    7/2009

OTHER PUBLICATIONS

Ishiduki M. et al., "Optimal Device Structure for Pipe-shaped BiCS Flash Memory for Ultra High Density Storage Device with Excellent Performance and Reliability," Electron Devices Meeting (IEDM), 2009 IEEE Int'l, Baltimore MD, pp. 27.3.1-27.3.4.

(Continued)

*Primary Examiner* — Bradley K Smith
*Assistant Examiner* — David Goodwin
(74) *Attorney, Agent, or Firm* — Haynes Beffel & Wolfeld LLP

(57) ABSTRACT

An integrated circuit device is described that includes a 3D memory comprising a plurality of self-aligned stacks of word lines orthogonal to and interleaved with a plurality of self-aligned stacks of bit lines. Data storage structures such as dielectric charge storage structures, are provided at cross points between word lines and bit lines in the plurality of self-aligned stacks of word lines interleaved with the plurality of self-aligned stacks of bit lines.

15 Claims, 22 Drawing Sheets

(56) References Cited

U.S. PATENT DOCUMENTS

| | | |
|---|---|---|
| 2010/0237312 A1* | 9/2010 | Seol et al. ............. 257/2 |
| 2010/0259961 A1* | 10/2010 | Fasoli et al. .......... 365/51 |
| 2011/0085370 A1* | 4/2011 | Chen et al. ........... 365/148 |
| 2011/0127483 A1* | 6/2011 | Sonehara ............. 257/2 |
| 2011/0180775 A1 | 7/2011 | Lin et al. |
| 2011/0227026 A1* | 9/2011 | Sekar et al. .......... 257/4 |
| 2012/0188813 A1 | 7/2012 | Chien et al. |
| 2013/0182487 A1 | 7/2013 | Lee et al. |

OTHER PUBLICATIONS

Jung S-M et al., "Three Dimensionally Stacked NAND Flash Memory Technology Using Stacking Single Crystal Si Layers on ILD and TANOS Structure for Beyond 30nm Node," Tech. Digest of IEEE Int'l Electron Devices Meeting (IEDM) 2006, San Francisco CA, pp. 37-40.

Sakamoto W., et al., "Reliability Improvement in Planar MONOS Cell for 20nm-node Multi-Level NAND Flash Memory and beyond," Tech. Digest of Int'l Electron Devices Meeting 2009, pp. 34.4.1-34.4.4.

Lai E-K. et al., "A Multi-Layer Stackable Thin-Film Transistor (TFT) NAND-Type Flash Memory," IEEE Int'l Electron Devices Meeting, 2006, 4pp.

Johnson M. et al., "512-Mb PROM With a Three-Dimensional Array of Diode/Anti-fuse Memory Cells," IEEE J. of Solid-State Circuits, 38:11, 2003, pp. 1920-1928.

U.S. Appl. No. 13/675,923, filed Nov. 13, 2012, 22 pages.

* cited by examiner

LOW COST SCALABLE 3D MEMORY

Benefit of U.S. Provisional Application No. 61/434,424, filed 19 Jan. 2011 is claimed.

BACKGROUND OF THE INVENTION

1. Field of the Invention

The present invention relates to high density memory devices, and particularly to memory devices in which multiple levels of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory", IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006. See also, U.S. Pat. No. 7,473,589, entitled STACKED THIN FILM TRANSISTOR, NON-VOLATILE MEMORY DEVICES AND METHODS FOR FABRTICATING SAME, by Lai et al., issued Jan. 6, 2009.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, Nov. 2003. In the design described in Johnson et al., multiple layers of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

In the processes described in Lai, et al., Jung, et al. and Johnson et al., there are several critical lithography steps for each memory layer. Thus, the number of critical lithography steps needed to manufacture the device is multiplied by the number of layers that are implemented. Critical lithography steps are expensive to implement and increase the layout area of the devices as area is added to accommodate inherent misalignment among the critical masks.

As the need for higher and higher memory capacity in integrated circuit memory devices continues to increase, it is desirable to provide a structure for three-dimensional integrated circuit memory with a low manufacturing cost, including reliable, very small memory elements that can be erased and programmed.

SUMMARY OF THE INVENTION

A stacked array architecture in which both the bit lines and the word lines are self-aligned, resulting in a structure in which the primary axes of stacked word lines in the multiple levels of the device are aligned, and also in which the primary axes of stacked bit lines in the multiple levels of the device are aligned by the manufacturing process, without misalignments due to the use of multiple lithographic masks.

An integrated circuit device is described that includes a 3D memory comprising a plurality of self-aligned stacks of word lines interleaved with and orthogonal to a plurality of self-aligned stacks of bit lines. As a result of the self alignment of the word line stacks, the word lines in a given stack in the plurality of self-aligned stacks of word lines are symmetric about respective primary axes, and the primary axes of the word lines in the given stack are aligned. Also, as a result of the self-alignment of the bit line stacks, the bit lines in a given stack in the plurality of self-aligned stacks of bit lines are symmetric about respective primary axes, and the primary axes of the bit lines in the given stack are aligned. Data storage structures, such as dielectric charge storage structures, are provided at cross points between word lines and bit lines to provide multiple levels of memory cells in a 3-D block.

An integrated circuit device is provided that includes a plurality of layers of memory cells. The array in the device includes a 3-D memory block having a first level including plurality of first-type conductor lines which are symmetrical about respective primary axes and arranged generally in parallel; a second level over the first level, and including plurality of second-type conductor lines arranged generally in parallel and orthogonal to the plurality of first-type conductor lines in the first level; a third level over the second level, and including plurality of first-type conductor lines which are symmetrical about respective primary axes and arranged generally in parallel, and a fourth level over the third level, and including plurality of second-type conductor lines arranged generally in parallel and orthogonal to the plurality of first-type conductor lines in the first level. There can be many more levels if desired. The primary axes of first-type conductor lines in the first level are aligned with the primary axes of corresponding first-type conductor lines in the third level. The primary axes of second-type conductor lines in the second level are aligned with the primary axes of corresponding second-type conductor lines in the fourth level.

A first array of data storage structures in the 3D memory block can comprise memory elements at cross points between upper surfaces of the first-type conductor lines in the first level and lower surfaces of the second-type conductor lines in the second level. A second array of data storage structures in the 3D memory block can comprise memory elements at cross points between lower surfaces of first-type conductor lines in the third level and upper surfaces of second-type conductor lines in the second level. A third array of data storage structures in the 3D memory block can comprise memory elements at cross points between upper surfaces of the first-type conductor lines in the third level and lower surfaces of the second-type conductor lines in the fourth level. The first-type conductor lines in the 3D block act as one of word lines and bit lines, and the second-type conductor lines act as the other of word lines and bit lines.

A method for manufacturing a device including a 3D block of memory is described. The method includes forming an assembly including a plurality of conductor layers separated by sacrificial layers. A first patterned etch process is applied to the assembly to remove material to form self-aligned stacks of first type conductor lines separated by trenches, the first type conductor lines in the self-aligned stacks being separated within the stacks by sacrificial lines. Then, a block is formed by filling between the self-aligned stacks of first type conductor lines with a fill material. A second patterned etch process selective for the fill material is applied to the assembly, that does not remove the first type conductor lines, to form trench structures orthogonal to the self-aligned stacks of first type conductor lines. Then the sacrificial lines in the self-aligned stacks of first type conductor lines exposed within the trench structures are removed, leaving openings between the first and second conductor lines. A layering process is applied within the trench structures, that involves layering conductor material and insulating material, in a manner that forms self-aligned stacks of second type conductor lines and insulating material. The conductor material for a given layer fills corresponding openings between the first type conductor lines in the trench structures. As a result of the layering process, the self aligned stacks of second type conductor lines are interleaved with the self-aligned stacks of first type conductor lines. Memory elements are formed at cross points between the interleaved first type conductor lines and second type conductor lines.

Other aspects and advantages of the present invention can be seen on review of the drawings, the detailed description and the claims, which follow.

DETAILED DESCRIPTION

A detailed description of embodiments is provided with reference to the FIGS. 1-31

Figure 1:
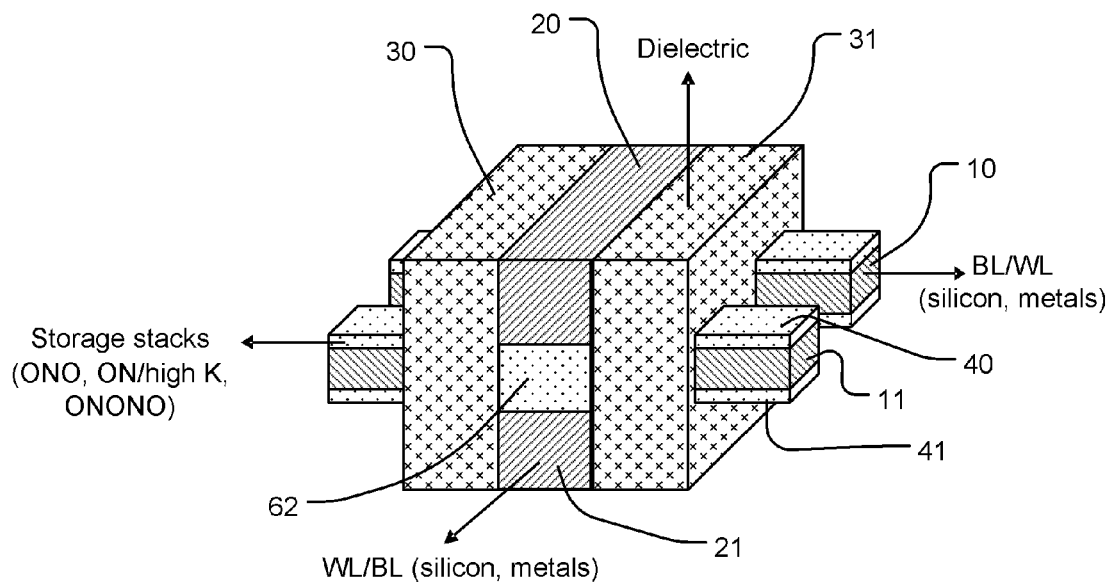
FIG. 1 is a simplified diagram of a block of a 3-D memory array illustrating aspects of the technology described herein.

FIG. 1 illustrates a block in a 3-D memory array including a plurality of first type conductor lines 10, 11 configured as one of bit lines and word lines (BL/WL) and a plurality of second type conductor lines 20, 21 configured as the other of word lines and bit lines (WL/BL). The conductor lines can be implemented using semiconductors such as silicon or metal such as tungsten, or other conductive materials as suits their use as a bit line or a word line for the particular memory cell technology being applied. In the illustrated embodiment, as can be seen with reference to the first type conductor line 11, memory structures 40, 41 are implemented as layers of material on the lower surface and the upper surface of each of the plurality of first type conductor lines. In a representative embodiment, the memory structures comprise dielectric charge trapping structures such as described for so-called SONOS memory cells including multiple dielectric layers (silicon oxide/silicon nitride/silicon oxide ONO, silicon oxide/silicon nitride/High-K dielectric, silicon oxide/silicon nitride/silicon oxide/silicon nitride/silicon oxide ONONO, and so on). The multiple dielectric layers can include a tunneling layer, a charge trapping layer and a blocking layer. Also, the multiple dielectric layers can include a variety of implementations of the structures, including bandgap engineered tunneling layers and the like. Other type of memory elements that can be used in the structures described herein include resistance change memories like phase change memory, metal oxide memory, fuse base one time programmable memory, and so on.

In one approach to form the structure shown in FIG. 1, the first type conductor lines 10, 11 are suspended across a trench between dielectric crossbar structures 30, 31, with space between the suspended lines. The second type conductor lines are formed by a self-aligned process of layering material in the trenches, that includes first depositing the second type conductor material within the trench, and etching back to define the second type conductor 21 as a damascene conductor line within the trench which contacts the memory material layer 41 on the lower surface of the first type conductor lines 10, 11. Then, isolation material is deposited within the trench to isolate the first type conductor lines from the second type conductor lines, and from one another, and etched back to a level corresponding with the upper surface of the first type conductor lines 10, 11, to form resulting isolation lines 61, 62. Then, the process includes second depositing the second type conductor material within the trench, and etching back to define the second type conductor 20, as a damascene conductor line within the trench which contacts the memory material layer 40 on the upper surface of the first type conductor lines 10, 11. Formation of the second type conductor lines in this manner results in formation of memory cells at the crosspoints of the interleaved stacks of self-aligned word lines and self-aligned bit lines.

Figure 2:
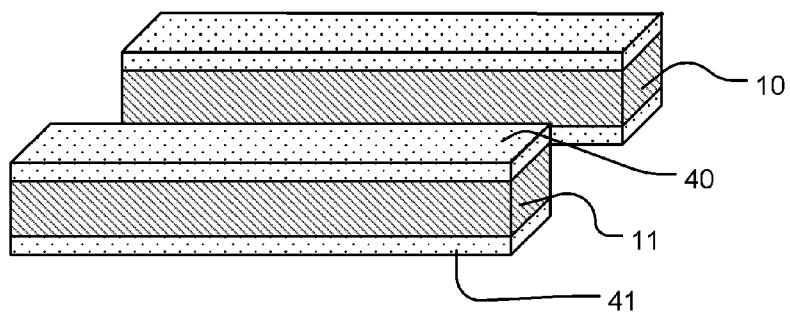
FIG. 2 through FIG. 5 illustrate stages of a manufacturing process for making a 3-D memory array as shown in FIG. 1.

FIGS. 2-5 show stages in a manufacturing process for the block of FIG. 1. In FIG. 2, illustrates the first type conductor lines, which can be bit lines for example. The first type conductor lines are formed by for example forming a multilayer stack with layers of memory material, layers of first type conductor material, layers of memory material and layers of sacrificial material. The multilayer stack can be patterned to define a plurality of first type conductor lines arranged generally parallel. If there are multiple layers of first type conductor lines to be formed, then the multilayer stack will include multiple layers to begin with, and the stacks of first type conductor lines can be formed in self aligned process, using a single etch mask. As a result of the patterning of the multilayer stack, the structure illustrated in FIG. 2 results, where the surrounding structure is omitted to simplify the drawing.

Figure 3:
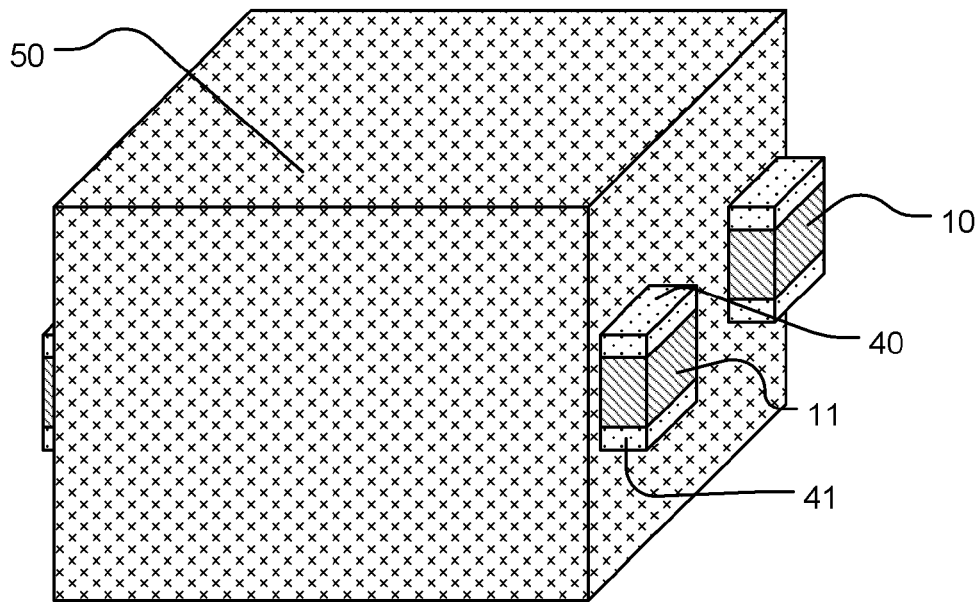
Figure 4:
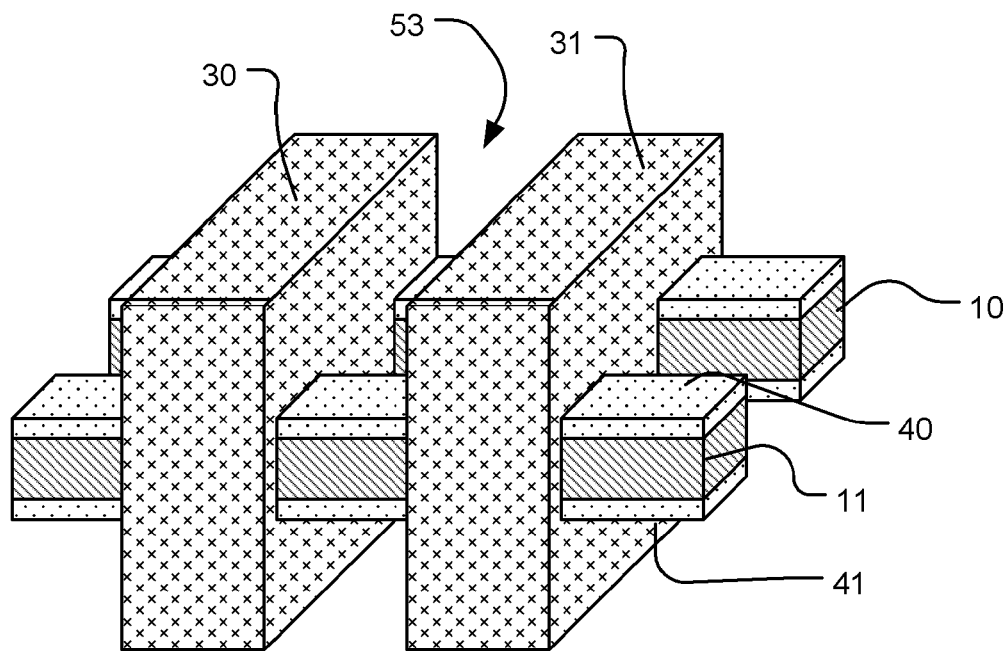

As shown in FIG. 3, in a next step a fill, such as silicon nitride or other dielectric material, is applied to the structure, creating a block 50 of fill material through which the first type conductor lines 10, 11 extend. As illustrated in FIG. 4, a pattern of trenches (e.g. 53) is defined in the block 50 using an etch process which is selective to the fill material of the block 50. For example, the fill material of the block 50 can be silicon nitride, which can be selectively etched relative to the silicon oxide or high K dielectric which covers the outside surfaces of the memory layers 40, 41, and relative to the first type conductor material. This results in structures 30, 31 of dielectric material, called "crossbar structures" herein, suspending the first type conductor lines 10, 11 through the trench 53. Voids are formed within the trench 53 above and below the first type conductor lines 10, 11 by removing sacrificial material between the bit line structures.

Figure 5:
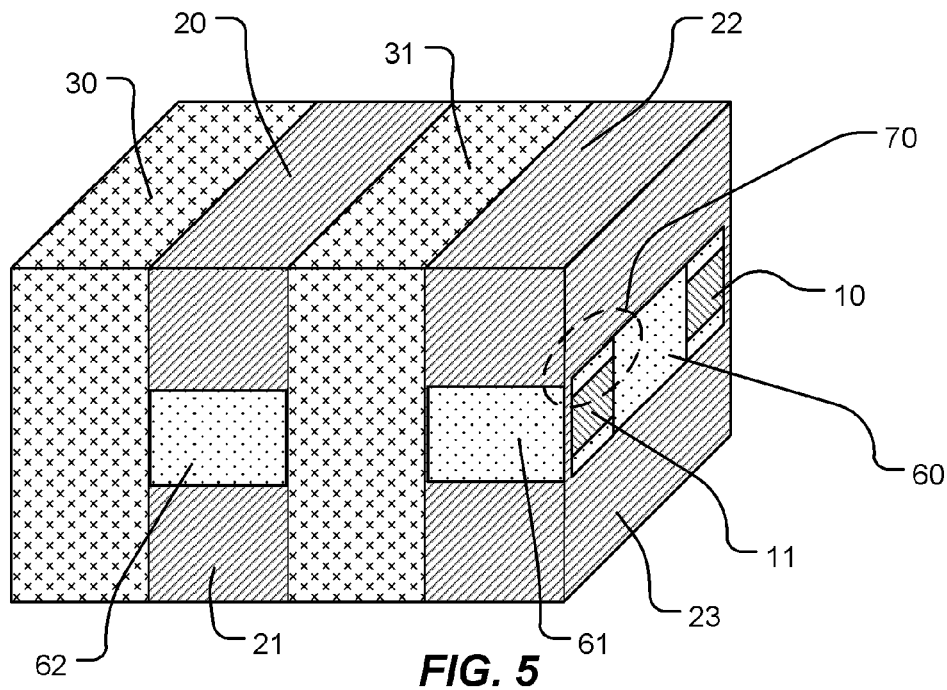

As illustrated in FIG. 5, the process next involves forming levels of damascene conductor lines within the trenches to define the second type conductor lines 20, 21, 22, 23 which are arranged generally parallel to one another, and orthogonal to and interleaved with the first type conductor lines 10, 11. Isolation material structures 60, 61, 62 are layered between the first type conductor lines 10, 11, and between the second type conductor lines 20, 21. The damascene conductor lines, and the isolation material structures 60, 61 are formed by a layering process that involves depositing the material, etching back to the desired level, and then depositing the next material and so on until the trenches are filled with self aligned conductor lines and isolation structures. Memory cells are formed at cross points (e.g. 70) of the interleaved conductors.

Figure 6:
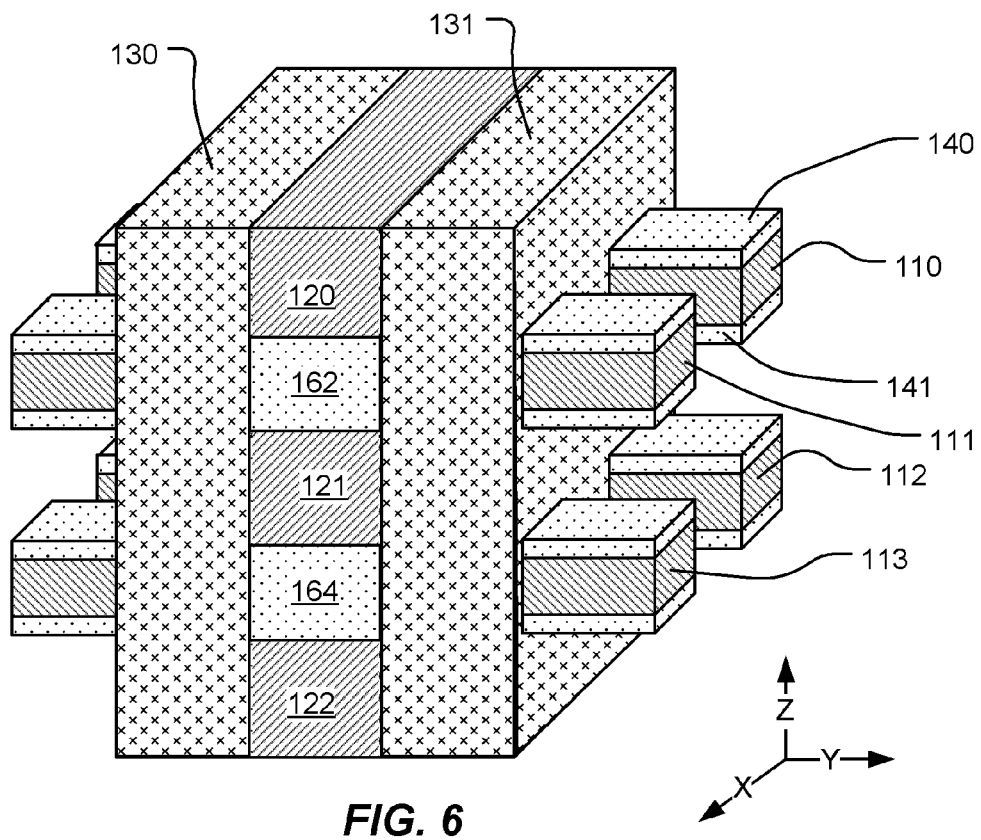
FIG. 6 is a simplified diagram of block of a 3-D memory array illustrating aspects of the technology described herein.

As mentioned above, the process can extend to multiple levels of first type conductor lines and multiple levels of second type conductor lines. A simplified illustration of a structure including two levels of first type conductor lines is shown in FIG. 6. A block in a 3-D memory array includes a plurality of first type conductor lines 110, 111 on a first level, and first type conductor lines 112, 113 on the second level, configured as one of bit lines and word lines (BL/WL). Second type conductor lines 120, 121, 122 are configured as the other of word lines and bit lines (WL/BL). In the illustrated embodiment, as can be seen with reference to the first type conductor line 110, memory structures 140, 141 are implemented as layers of material on the lower surface and the upper surface of each of the plurality of first type conductor lines.

In one approach to form the structure shown in FIG. 6, the first type conductor lines 110, 111, 112, 113 are suspended across a trench between dielectric crossbar structures 130, 131. The second type conductor lines are formed by a self-aligned damascene layering process that includes first depositing the second type conductor material within the trench, and etching back to define the second type conductor 122 as a damascene conductor line within the trench which contacts the memory material layer 141 on the lower surface of the first type conductor lines 112, 113, resulting in formation of memory cells at the crosspoints. Then, isolation material is deposited within the trench to isolate the first type conductor lines from the second type conductor lines, and from one another, and etched back to a level corresponding with the upper surface of the first type conductor lines 112, 113, to form resulting isolation lines 164. Then, the process includes second depositing the second type conductor material within the trench, and etching back to define the second type conductor 121, as a damascene conductor line within the trench which contacts the memory material layer 140 on the upper surface of the first type conductor lines 112, 113. This process is repeated to form the second type conductor lines 121 in the second level, isolation lines 162, second type conductor lines 120 in the third level and so on. This results in formation of memory cells at the crosspoints of the interleaved plurality of first type conductor lines and second type conductor lines, so that the portion of the structure shown in FIG. 6 has 16 memory cells in four levels. This structure can be implemented with many levels, such as eight levels, sixteen levels or more, of memory cells to implement very high density, 3-D memory.

Figure 7:
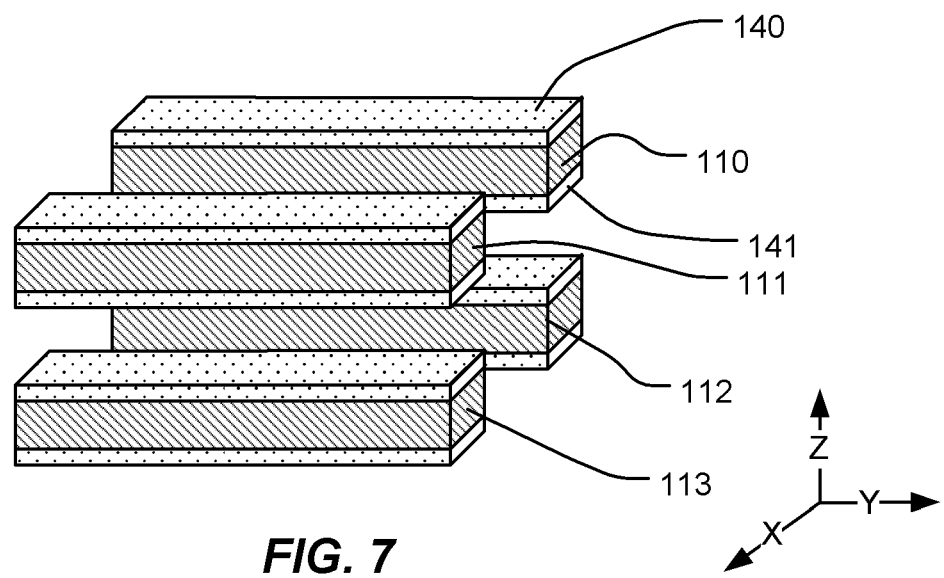
FIG. 7 through FIG. 10 illustrates stages of a manufacturing process for making a 3-D memory array as shown in FIG. 6.

FIGS. 7-10 show stages in a manufacturing process for a block like that of FIG. 6. FIG. 7 illustrates the first type conductor lines, which can be bit lines for example. The first type conductor lines are formed by for example forming a multilayer stack with layers of memory material, layers of first type conductor material, and layers of sacrificial material interleaved. The multilayer stack can be patterned to define a plurality of stacks of first type conductor lines arranged generally parallel. If there are multiple layers of first type conductor lines to be formed, then the multilayer stack will include multiple layers to begin with, and the stacks of first type conductor lines can be formed in self aligned process, using a single etch mask. As a result of the patterning of the multilayer stack, the structure illustrated in FIG. 7 results, where the surrounding structure is omitted to simplify the drawing.

Figure 8:
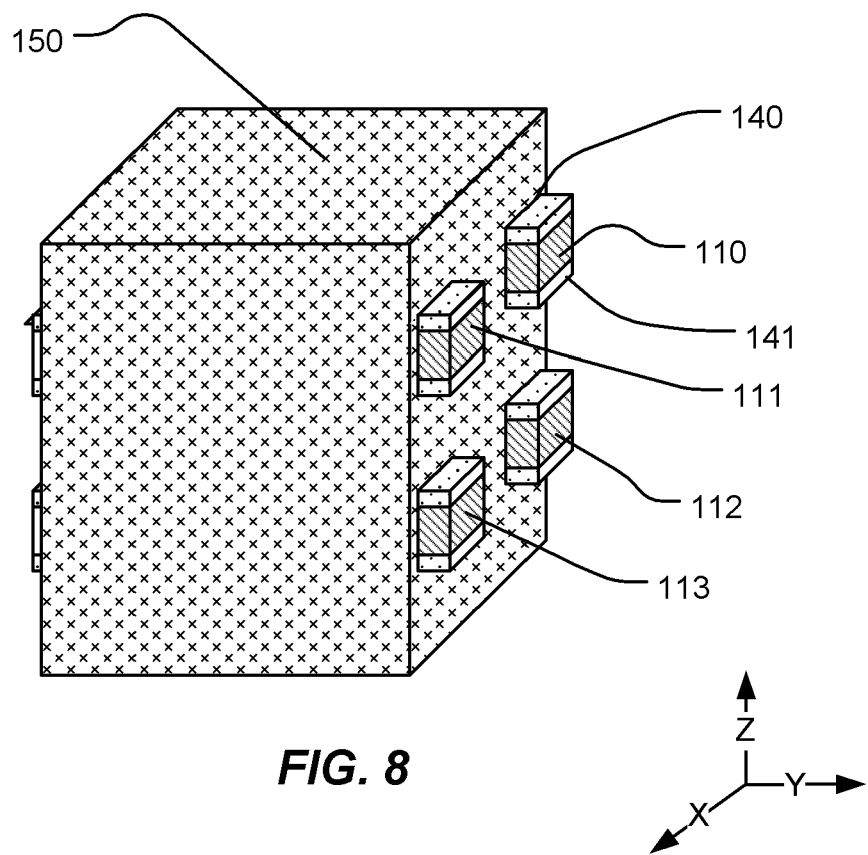

As shown in FIG. 8, in a next step a fill is applied to the structure creating a block 150 through which the first type conductor lines 110, 111, 112, 113 extend.

Figure 9:
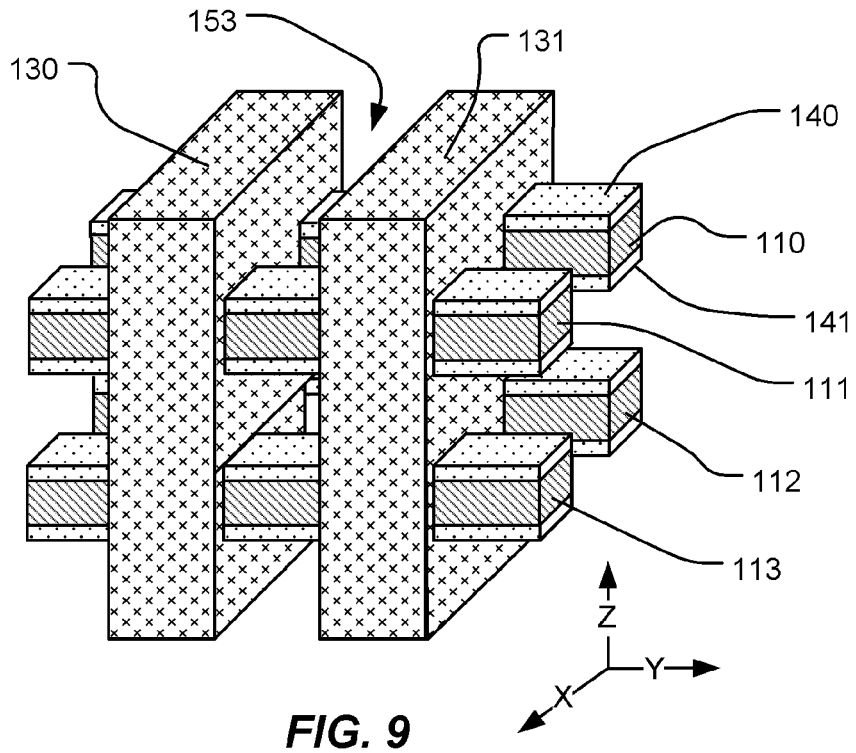

As illustrated in FIG. 9, a pattern of trenches (e.g. 153) is defined in the block 150 using an etch process which is selective to the fill material of the block 150. For example, the material of the block 150 can be silicon nitride which can be selectively etched relative to the silicon oxide or high K dielectric which covers the outside surfaces of the memory layers 140, 141, and relative to the first type conductor material. This results in crossbar structures 130, 131 of fill material suspending the first type conductor lines 110, 111, 112, 113 through the trench 153. Voids are formed within the trench 153 above and below the first type conductor lines 110, 111, 112, 113, such as by removing the layers of sacrificial material in the stacks.

Figure 10:
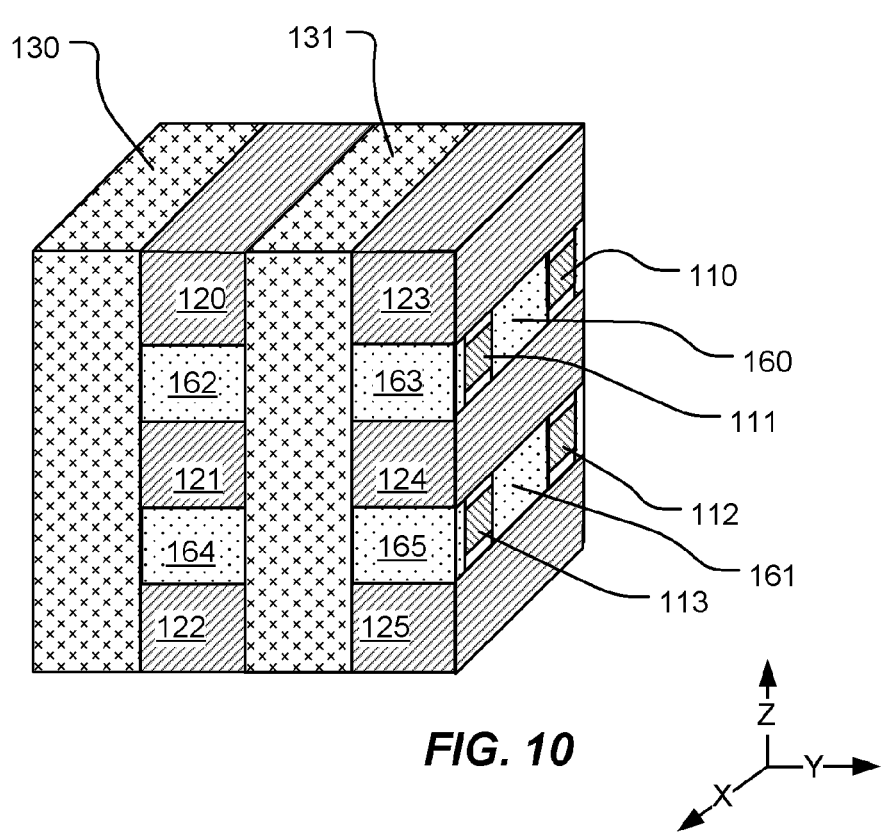

As illustrated in FIG. 10, the process next involves forming levels of damascene conductor lines within the trenches to define the second type conductor lines 120, 121, 122, 123, 124, 125 which are arranged generally parallel to one another, and orthogonal to and interleaved with the first type conductor lines 110, 111, 112, 113. Isolation material structures 160, 161, 162, 163, 164, 165 are formed between the first type conductor lines 110, 111 and 112, 113, and between the second type conductor lines 120, 121, 122, 124, 125. The damascene conductor lines, and the isolation material structures are formed by a layering process that involves depositing the material, etching back to the desired level, and then depositing the next material and so on until the trenches are filled with self aligned conductor lines and isolation structures.

Figure 11:
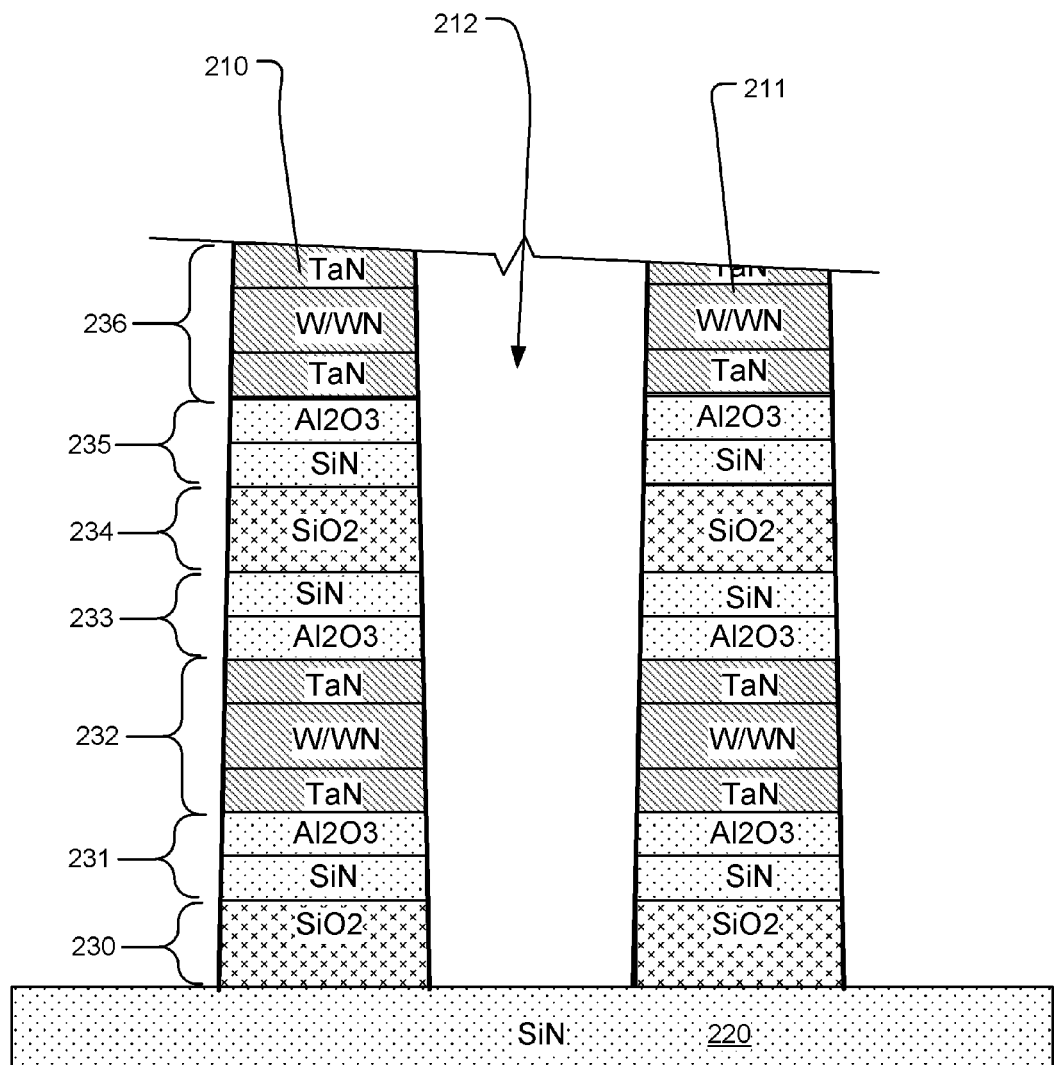
FIG. 11 is a cross-section of a plurality of self aligned bit line stacks, including bit line conductors separated by sacrificial layers of material.

FIGS. 11 to 18 illustrate stages in a representative process for forming a structure like that of FIG. 6, using materials as labeled in the figures. Of course, many other materials can be utilized in the formation of the structure is described herein. In FIG. 11, a structure that can result from etching a block comprising a multilayer stack materials, which after patterning includes multilayer bit line stacks 210, 211 in self aligned structures. The structures are self aligned in the example by being formed using a single etch mask in an etch process which cuts through the multilayer stack. As a result of the self aligned process, the primary axes of each of the layers in the stacks 210, 211, which primary axes are orthogonal to the page in this illustration, are aligned, lying vertically over one another. Also, each of the layers is symmetrical about its primary axis, within manufacturing variations that arise in the etching. The structure is the result of applying a self aligned process for forming the ridges that comprise a plurality of bit lines in a stack, referred to herein as a self-aligned stack of conductor lines.

The structure includes stacks 210, 211 on opposing sides of trenches (e.g. 212) formed in the patterning step. Each stack 210, 211 comprises a plurality of levels. In this example, each stack 210, 211 includes a bottom sacrificial layer 230 consisting in this example of silicon dioxide, followed by at least portions of the memory layer 231, which consists in this example of a layer of silicon nitride and a layer of aluminum oxide. The memory layer 231 is in contact with the lower surface of a bit line layer 232. The bit line layer 232 includes a multilayer stack of tantalum nitride, tungsten or tungsten nitride, and tantalum nitride in sequence in this example. Next another memory layer 233 lies on the upper surface of the bit line layer 232. In this example, the memory layer 232 includes a layer of aluminum oxide and a layer silicon nitride. Above the second memory layer 232, another sacrificial layer 234, again silicon oxide in this example, is formed. Above the second sacrificial layer 234, another memory layer 235, again comprising silicon nitride and aluminum oxide is formed. Then another bit line layer 236 implemented using in this example the same pattern tantalum nitride, tungsten or tungsten nitride, and tantalum nitride. In this example, the multilayer bit line stacks are formed on a substrate 220 of silicon nitride or other appropriate substrate on an integrated circuit. In this illustration, there are two levels of bit line layers (232, 236). In other embodiments, there can be many more levels as suits the density requirements of a particular embodiment.

Figure 12:
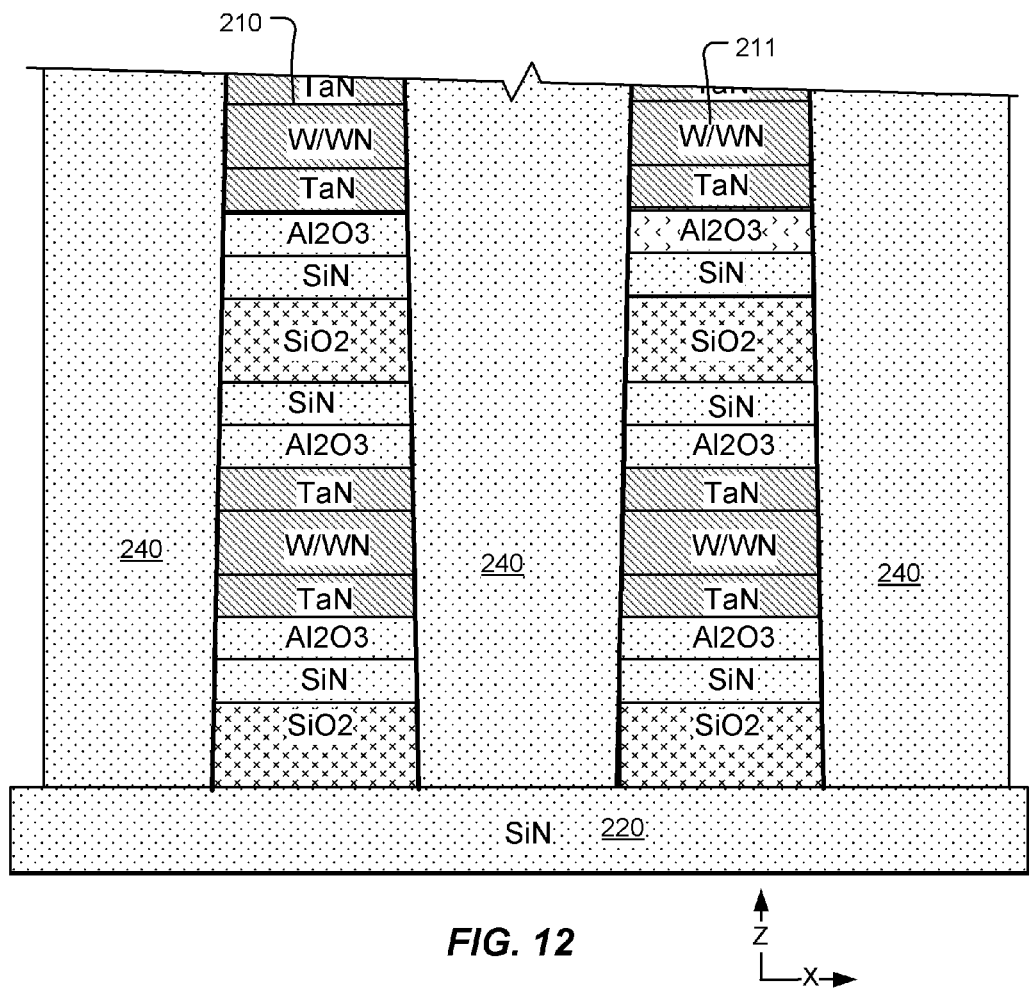
FIG. 12 illustrates the results of applying a fill material to the structure of FIG. 11.
Figure 13:
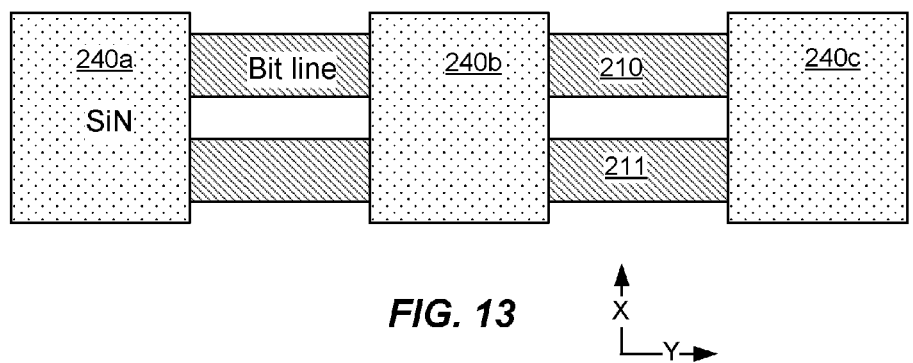
FIG. 13 provides a top view perspective of a structure resulting from etching trenches in the structure of FIG. 12 orthogonal to the plurality of self aligned bit line stacks.

FIG. 12 illustrates a result of applying a fill 240, such as silicon nitride over the structure of FIG. 11. This structure shown in FIG. 12 corresponds to the stage in the process shown in FIG. 3. As mentioned above the block that result from the fill process is then subjected to an etch process to define the trenches orthogonal to the multilayer bit line stacks. FIG. 13 illustrates a top view of the structure after forming the trenches, leaving bit line stacks 210, 211 extending between silicon nitride crossbar structures (240a, 240b, 240c). Of course in some embodiments, there can be on the order of 1000 or more bit line stacks 210, 211 extending across a single trench.

Figure 14:
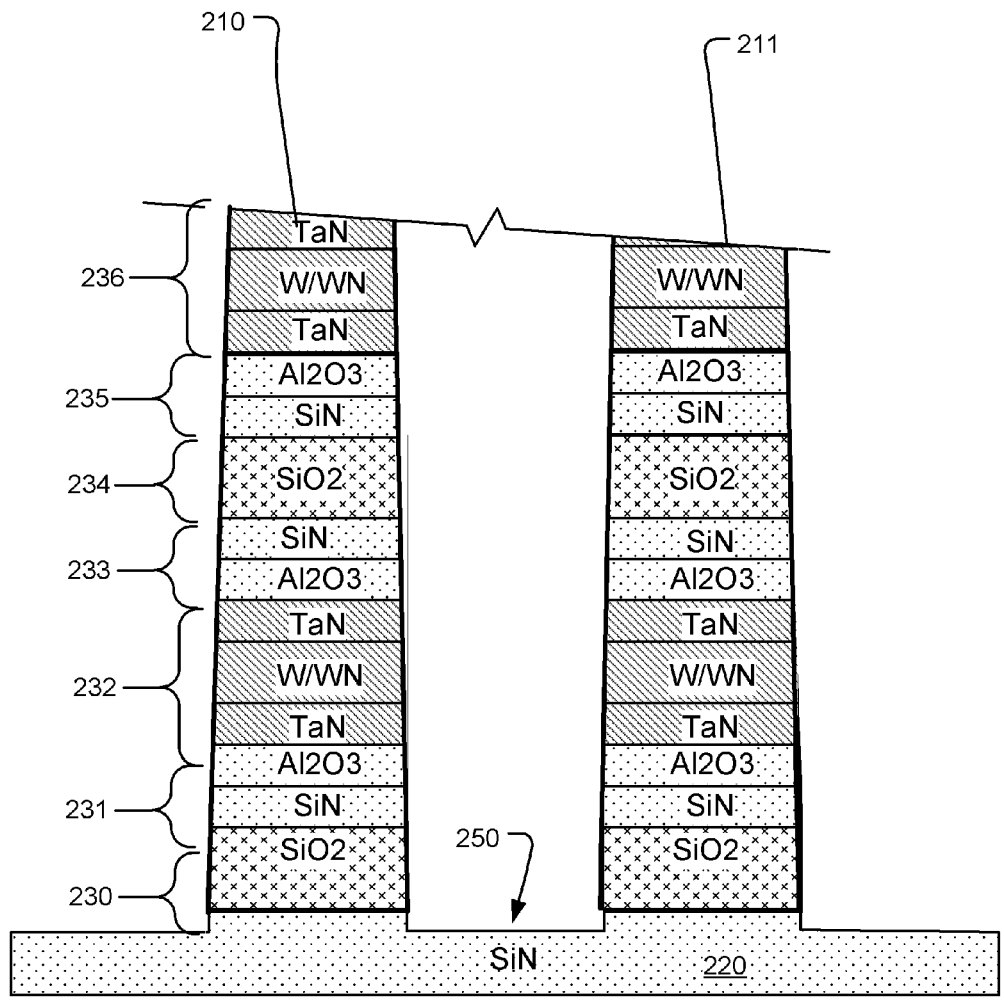
FIG. 14 is a cross-section view of the structure illustrated in FIG. 13, taken inside one of the trenches.

FIG. 14 is a cross-section taken within one of the trenches cutting through the bit line stacks 210, 211 inside the trench. Thus, the bit line stacks 2010, 211 have primary axes perpendicular to the illustration, and extend across the trench. This view appears similar to the structure of FIG. 11, except that within the trenches orthogonal to the bit line stacks 210, 211, and over-etch region 250 can occur, and is illustrated as recesses in the silicon nitride substrate 220.

Figure 15:
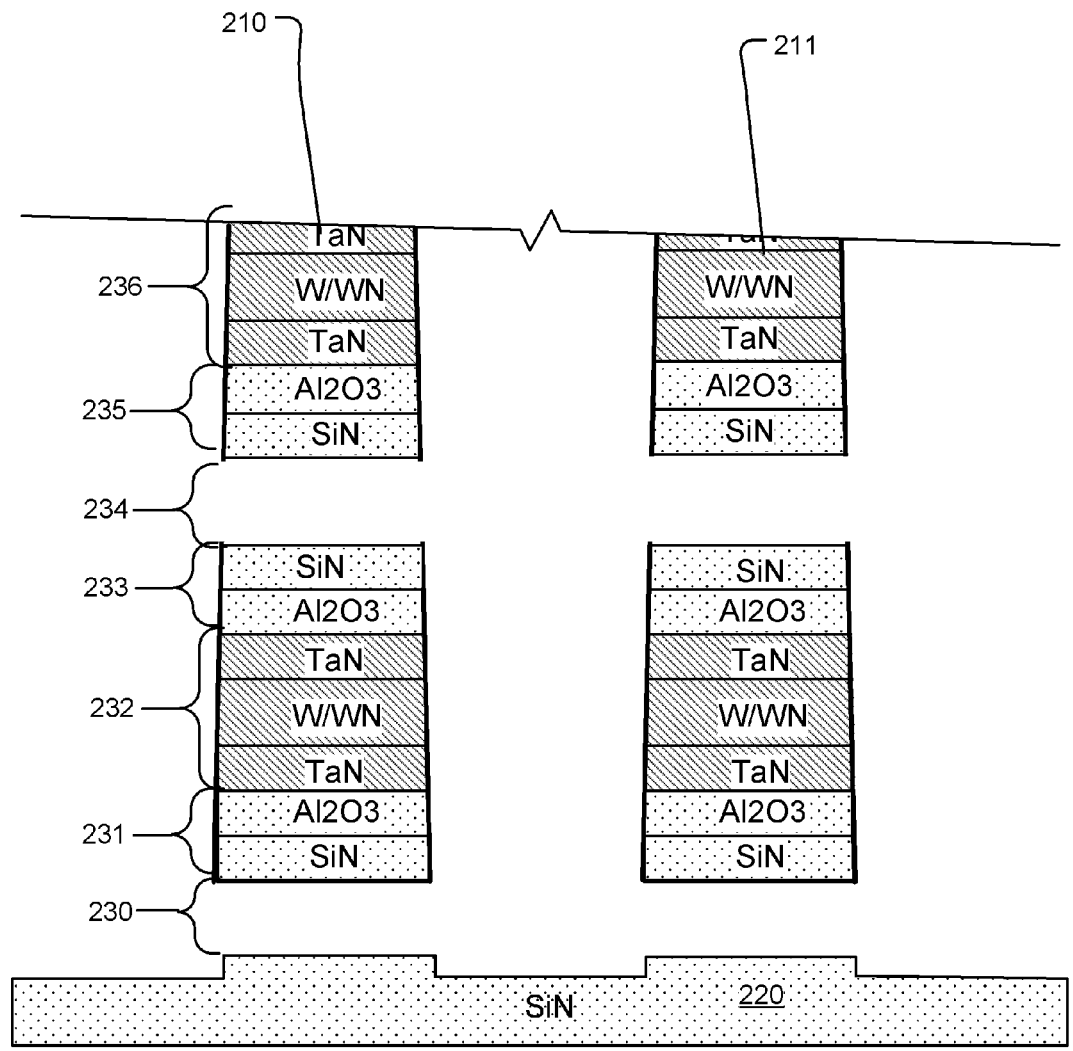
FIG. 15 illustrates results of applying a selective etch process to remove sacrificial layers from the self aligned bit line stacks from the structure of FIG. 14.

FIG. 15 illustrates results of a next step in the process. In this step, the structure is exposed to an etch process which is selective to the sacrificial material (230, 234) which in this example is silicon oxide, and does not attack the silicon nitride crossbar structures (240a, 240b, 240c). This removes the silicon oxide sacrificial layers 230, 234 from the bit line stacks 210, 211, resulting in suspended bit lines 232, 236 with portions of the memory elements 231, 233, 235, comprising aluminum oxide and silicon nitride layers in this example, on at least one of their upper and lower surfaces. As can be seen in this example, the memory elements 231, 233, 235 are formed on both the lower and upper surfaces of the bit line layers 232, 236.

Figure 16:
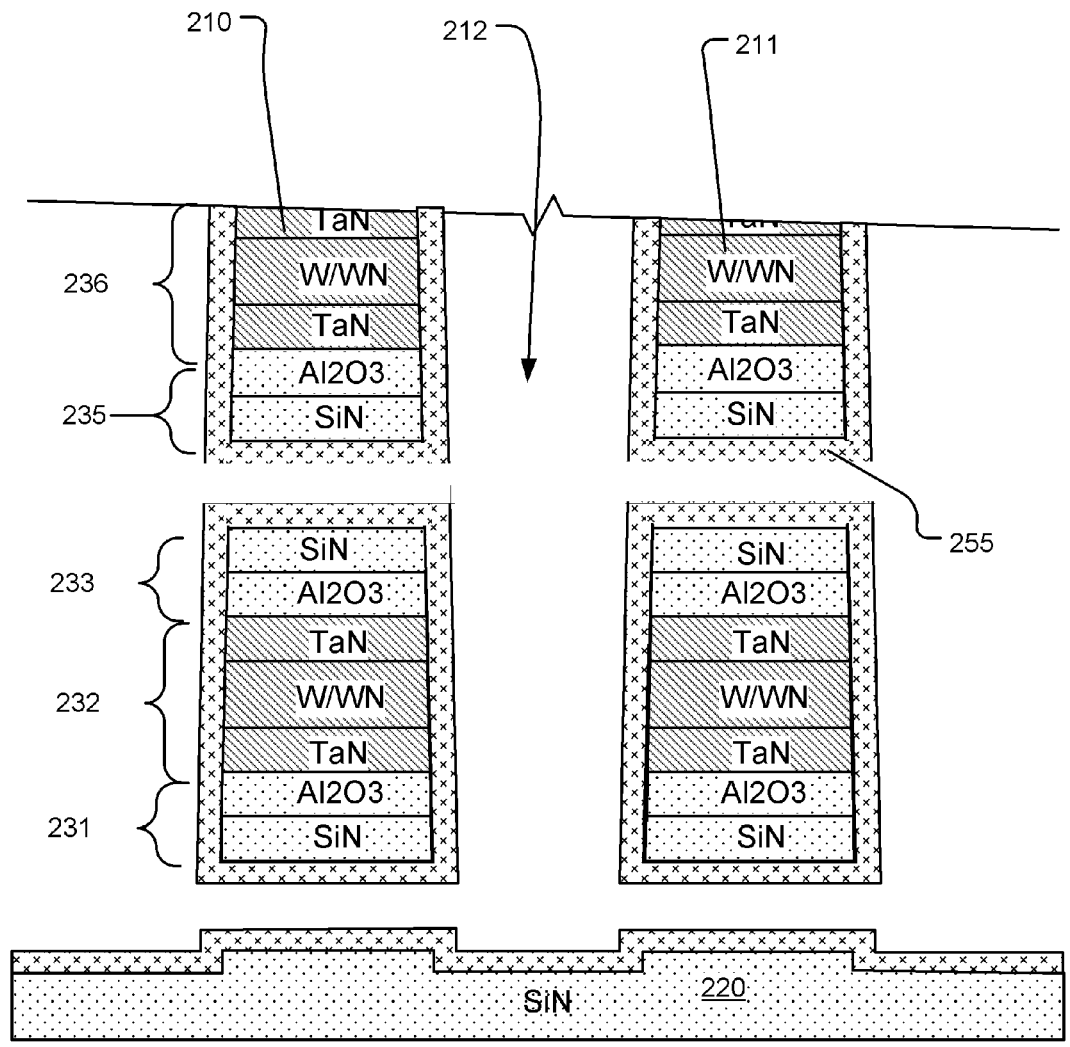
FIG. 16 illustrates result of applying a process to form a thin film tunneling dielectric on the structure of FIG. 15.

FIG. 16 illustrates results of a following step in the process. In the following step, a tunneling dielectric layer 255 is grown, which in this example is silicon dioxide grown using thermal process over the suspended bit lines 232, 236 and memory elements 231, 233, 235. The addition of the tunneling dielectric layer 255 completes the memory elements for the memory cells. Thus the memory cells in this example are dielectric charge trapping memory cells that have a tunneling dielectric, of silicon oxide, a charge trapping layer of silicon nitride, and a blocking layer of aluminum oxide.

Figure 17:
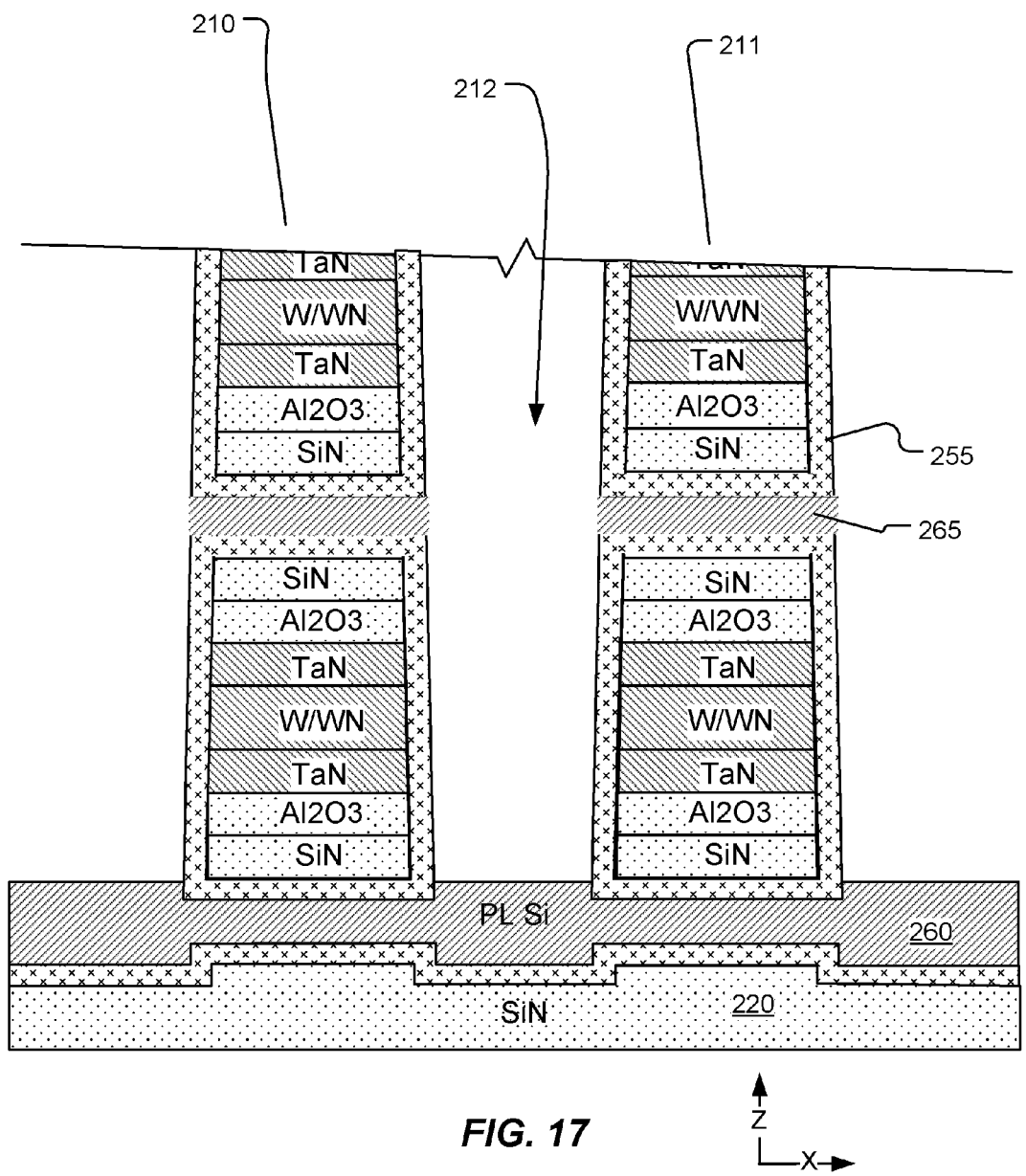
FIG. 17 illustrates results of applying a process to form a first layer of word line material, such as polysilicon, inside the trenches of FIG. 15.

FIG. 17 illustrates the structure after a process for forming a first layer word lines 260 within the trench 212 using a deposition process which fills the opening left by removal of the sacrificial layers, and below the first suspended bit line 232. The layer can be formed by the deposition of a word line material such as polysilicon in this example, followed by an etch back process that lowers the depth of the polysilicon to a level as shown, forming a word line having a upper surface just above the lower level of the memory structure on the lower surface of the first suspended bit line 232. As a result of this process, the word line material can also deposited within the voids in the bit line stacks in upper levels, filling the illustrated void with word line material in the region 265, that may not be removed by the etch back process.

Figure 18:
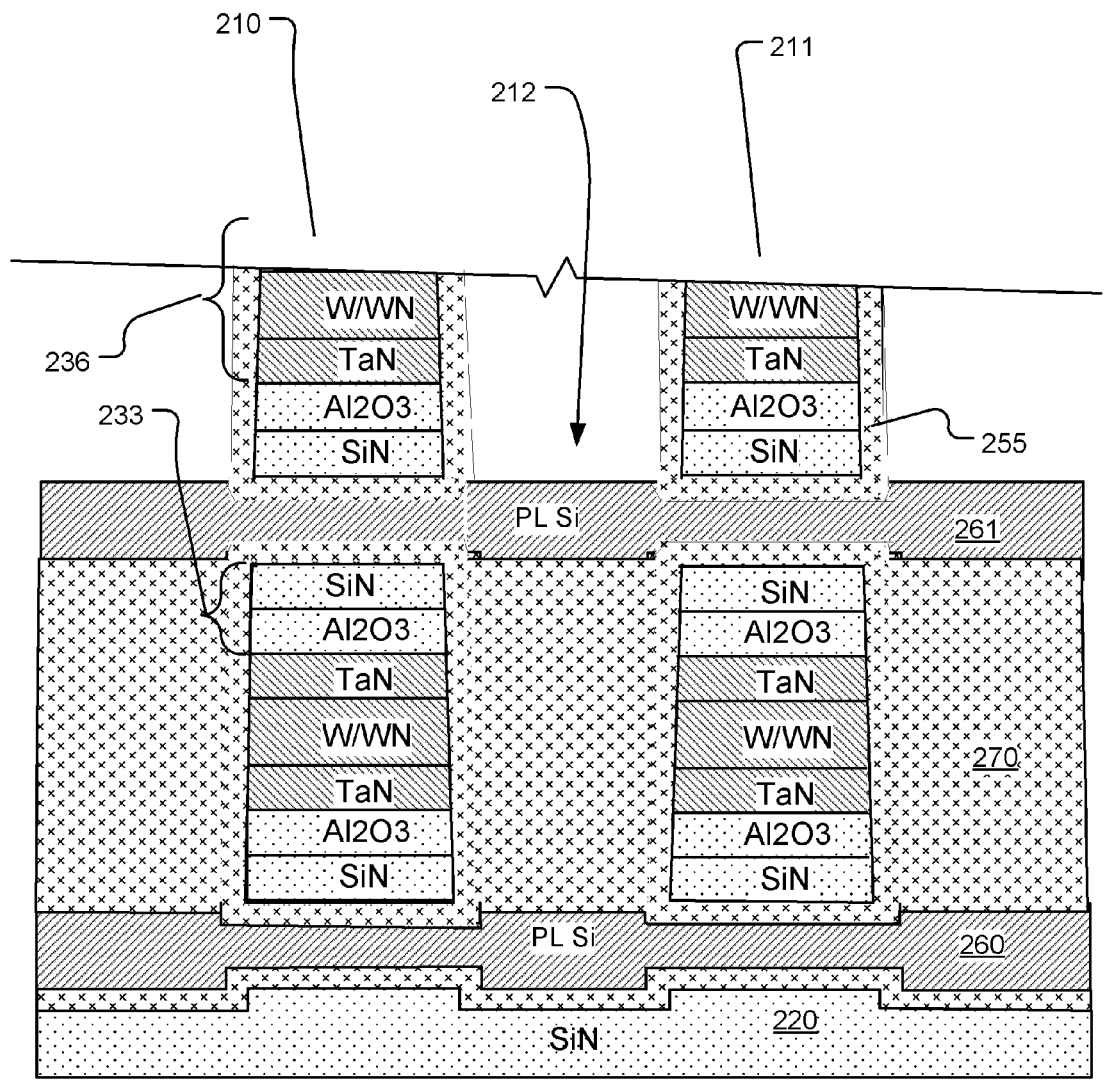
FIG. 18 illustrates results of applying a process to form a second layer of word line material inside the trenches over the first layer shown in FIG. 17.

FIG. 18 illustrates the results of layering steps applied to form the next level of word lines. The layering steps can include applying a fill 270, such as silicon oxide, up to the upper surface of the second memory element 233 in the bit line stacks 210, 211. Then, word line material is deposited an etched back to form the second level of word lines 261, having an upper surface near the lower surface of the memory material for the second suspended bit line structure 236. This process is repeated to form all of the multiple levels of word lines. As a result of forming the word lines within a trench, damascene word line structures are formed in self aligned stacks. The primary axes of the word lines which in this illustration lay within or parallel to the page are aligned over one another, and the word lines are symmetrical about their primary axes, as determined by the shape of the trenches. Since the trenches are formed in a single etch process, self aligned word line structures are formed that are interleaved with self aligned bit line structures, with memory elements at crosspoints.

Figure 19:
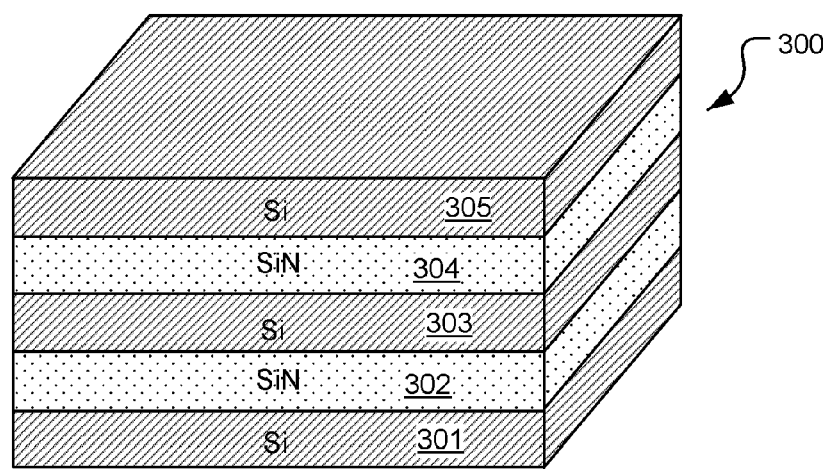
FIGS. 19 through 24 illustrates stages in a process for forming a plurality of self aligned stacks of word lines suspended across trenches, similar to the structure of FIG. 6.

FIGS. 19 to 31 illustrate a process for forming a similar 3D memory array, in which the memory elements can be implemented differently. FIG. 19 illustrates a multilayer stack of semiconductor 301 such as silicon, sacrificial material 302 such as silicon nitride, semiconductor 303 such as silicon, sacrificial material 304 such as silicon nitride and, semiconductor 305 such as silicon. Of course other materials suitable for use as word lines and sacrificial materials can be utilized.

Figure 20:
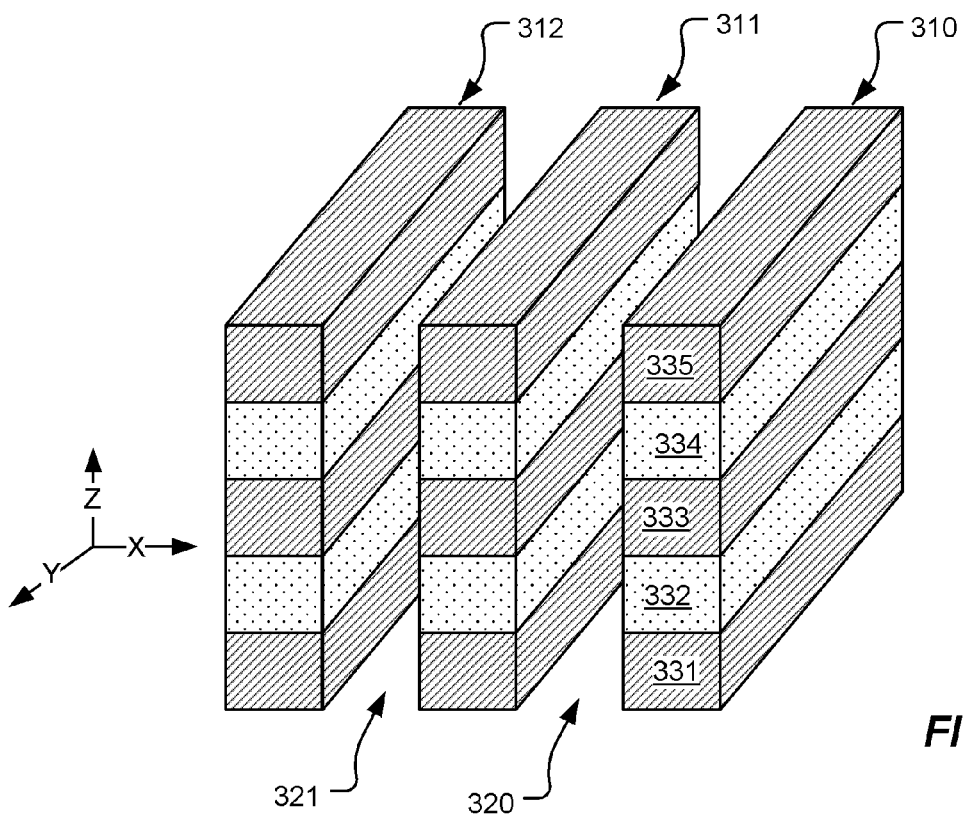

FIG. 20 illustrates a process of patterning word line stacks 310, 311, 312 in the multilayer block of FIG. 19, separated by trenches 320, 321. As can be seen, the memory material have not been included in the multilayer stacks at this stage in contrast to the process described with reference to FIGS. 11-18 which portions of the memory elements were included in the stacks.

Figure 21:
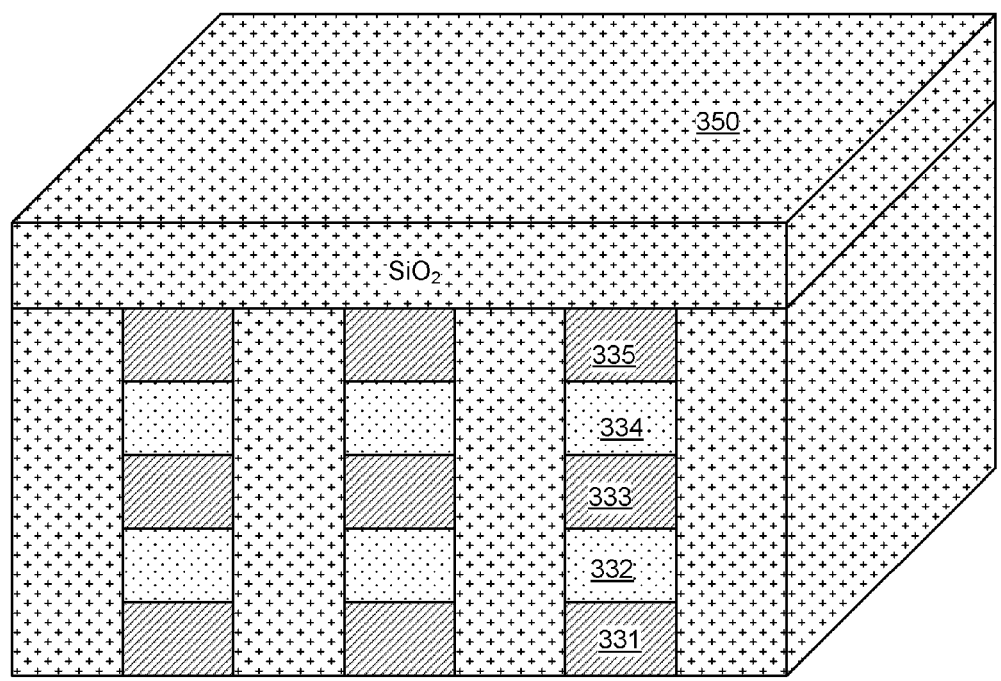

FIG. 21 illustrates the results of applying a fill 350 such as silicon oxide or other material that can be etched selectively relative to the sacrificial material used in the layers 332, 334, over the word line stacks 310, 311, 312.

Figure 22:
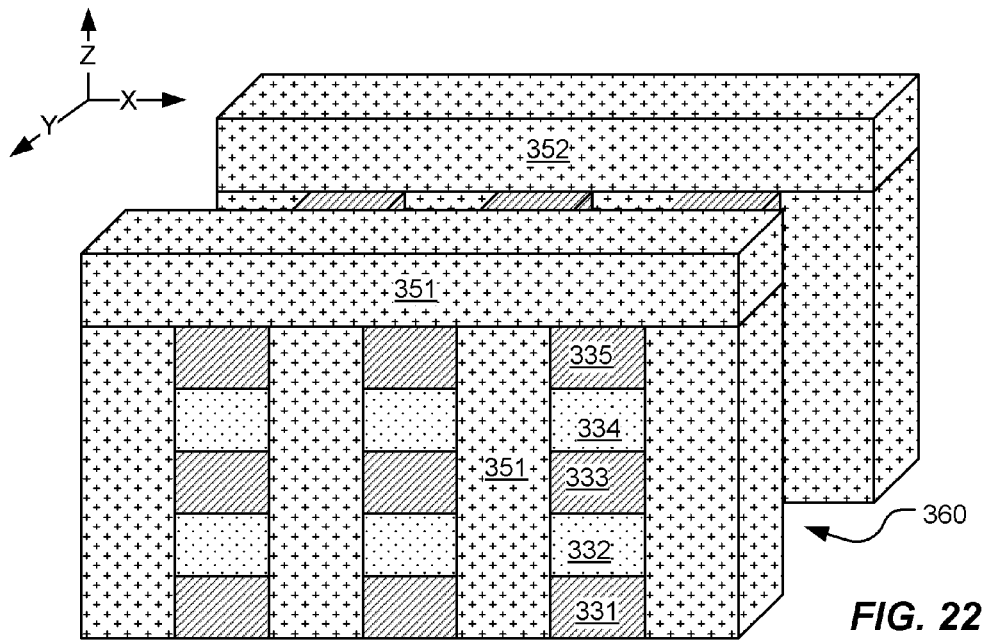

FIG. 22 illustrates the results of forming trenches 360 orthogonal to the word line stacks 210, 311, 312, taking away the fill 350 while leaving the word line stacks 310, 311, 312 extending across the trenches and supported by crossbar structures 351, 352. This diagram is rotated relative to the trench structure of FIG. 9, and implements word lines in the stacks 310, 311, 312 rather than bit lines. I In FIG. 23, the structure of FIG. 22 is illustrated with the crossbar structure 351 on the front of the diagram partially removed, to show the suspended word line structures after following process steps. In the following process steps, the structure has been subjected to a selective etch, removing the sacrificial silicon nitride within the trenches in the layers 334, 332 between the word lines 331, 333, 335.

Figure 23:
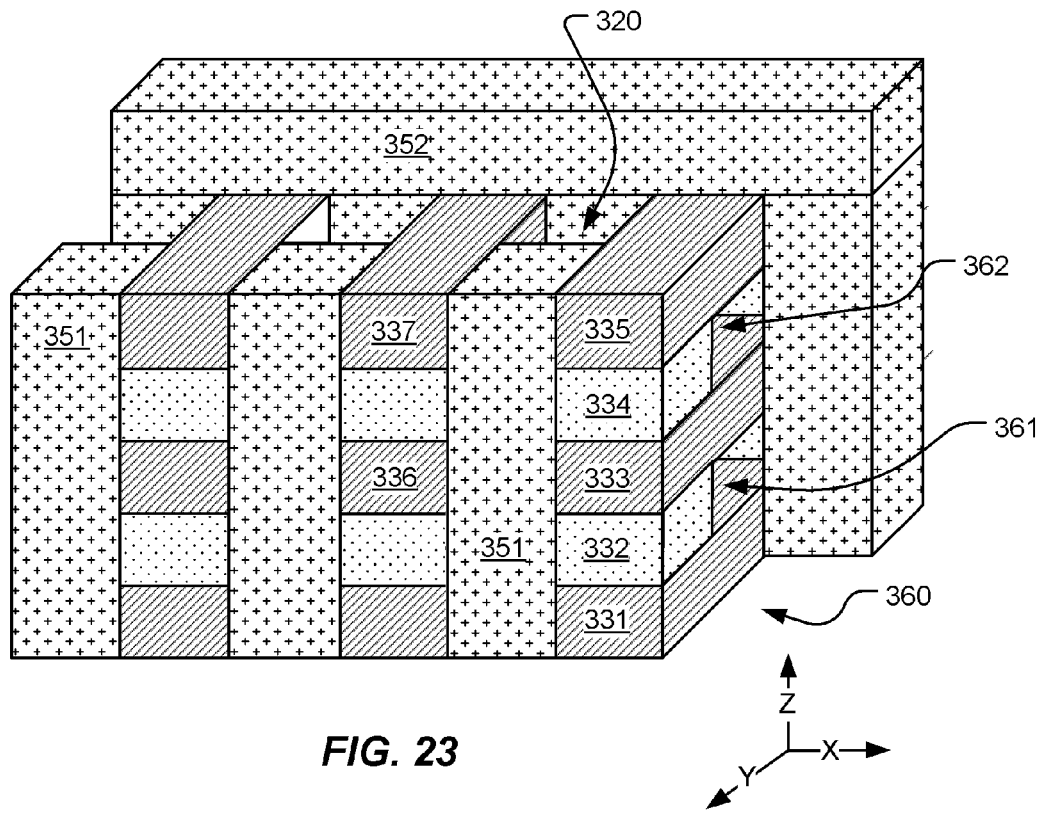
Figure 24:
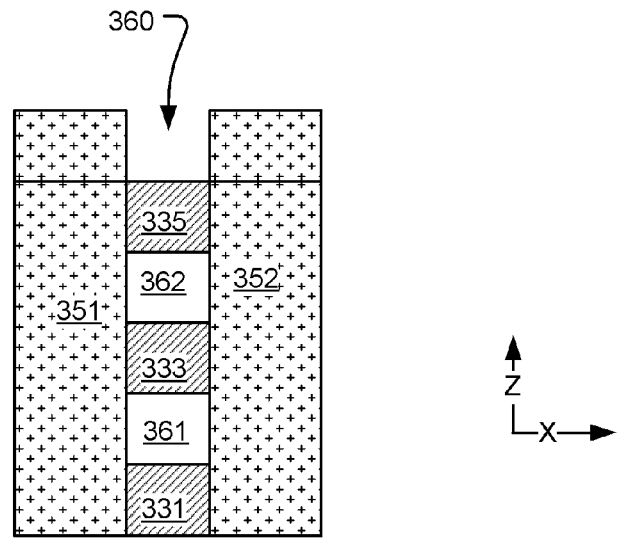

FIG. 24 shows a side view of the structure of FIG. 23, where the word lines 331, 333, 335 have primary axes lying parallel with the page through the silicon nitride crossbar structures 351, 352 and are suspended inside the trench 360. The sacrificial silicon nitride in the region 361, 362 within the trenches between the word lines is removed by a selective wet etch for example, leaving word line silicon conductor lines 331, 333, 335 suspended across the trenches 360.

Memory elements can be provided for the multilayer stacks in a variety of processes. In some embodiments, providing memory elements includes forming layers of material used as at least portions of the memory elements between the first type conductor and the sacrificial layers in the assembly, before applying the first patterned etch process. In other embodiments, providing memory elements includes forming layers of material used as at least portions of the memory elements on upper and lower surfaces of the first type conductor lines within the trench structures, after applying the second patterned etch process that defines the trenches.

Figure 25:
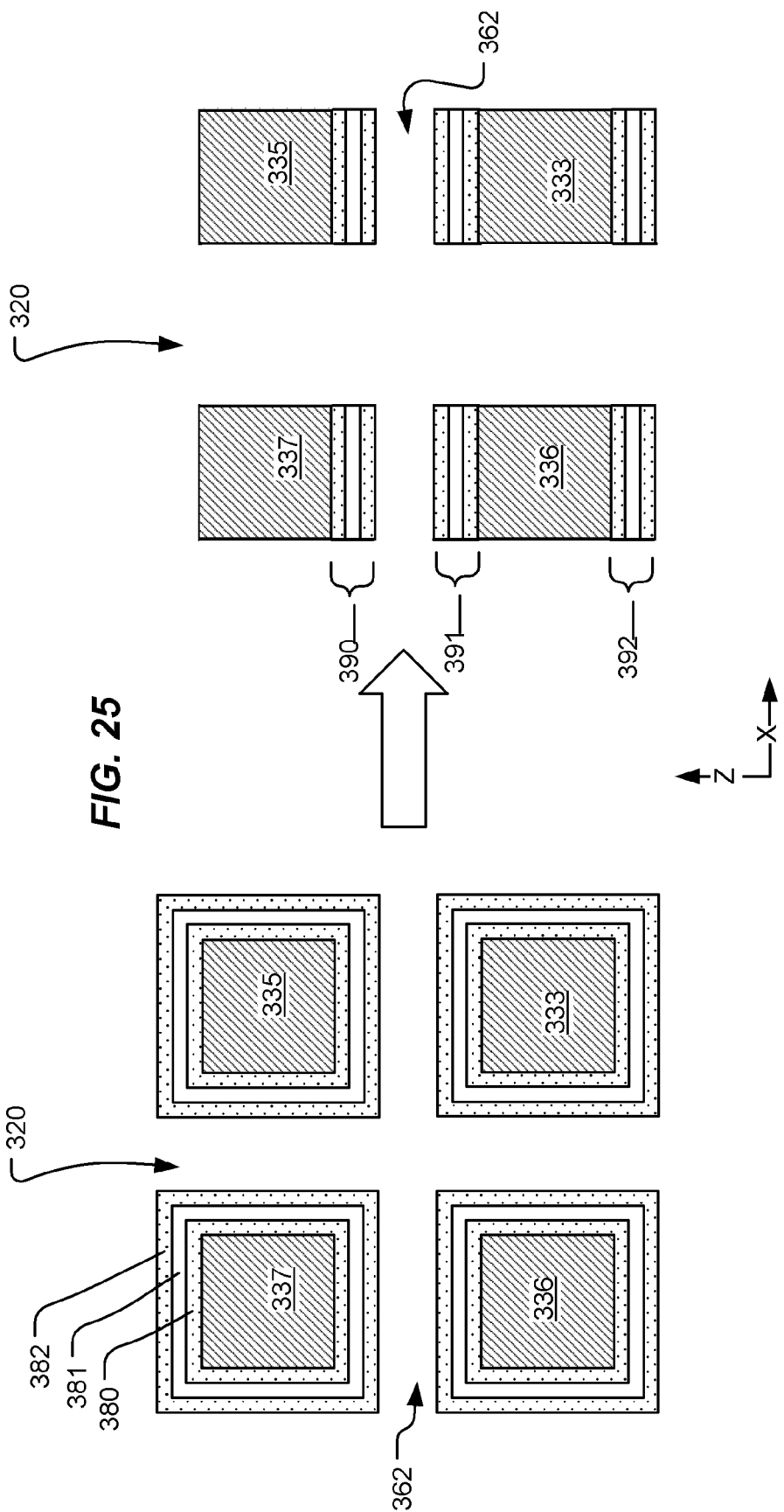
FIG. 25 illustrates a first process for forming memory elements on the suspended conductor lines of the structure like that of FIG. 24.

FIG. 25 shows (utilizing reference numbers from FIG. 23 for corresponding structures) the formation of multilayer charge trapping structures by a sequence of steps, in a manner that surrounds the suspended word lines 333, 335, 336, 337 which cross the trenches. Using a process like that of FIG. 25, providing memory elements for the interleaved stacks includes forming at least one of a layer of material of the blocking layer, a layer of material of the charge trapping layer and a layer of material of the tunneling layer between conductor layers in the plurality of conductor layers and the sacrificial layers; and forming at least one remaining layer of the blocking layer, the charge trapping layer and the tunneling layer, to complete the dielectric charge trapping memory elements after removing the sacrificial lines. A process can be applied for example which grows thin film tunneling layer 380, such as silicon oxide. In some embodiments, the tunneling layer 380 can be a multilayer tunneling layer such as a bandgap engineered tunneling structure including layer of silicon oxide about 2 nm or less thick, layer of silicon nitride about 2 nm thick, and a layer of silicon oxide about 2 nm thick. After formation of the tunneling layer 380, the charge trapping layer 381, such as silicon nitride on the order of 5 nm thick, or other charge trapping material, can be grown. Over the charge trapping layer 381, a blocking dielectric layer 382 such as aluminum oxide or silicon oxide on the order of 7 to 9 nm thick be grown. After formation of the charge trapping structures, an anisotropic etch procedure is used to remove the multilayer charge trapping structures from the side surfaces of the conductor lines 333, 335, 336, 337 and optionally from the top surfaces of the top conductor lines 335, 337. As result, memory elements 390, 391, 392 are formed on the upper and lower surfaces of the suspended word lines 336, 333, and on the lower surfaces of the suspended word lines 337 and 335.

Figure 26:
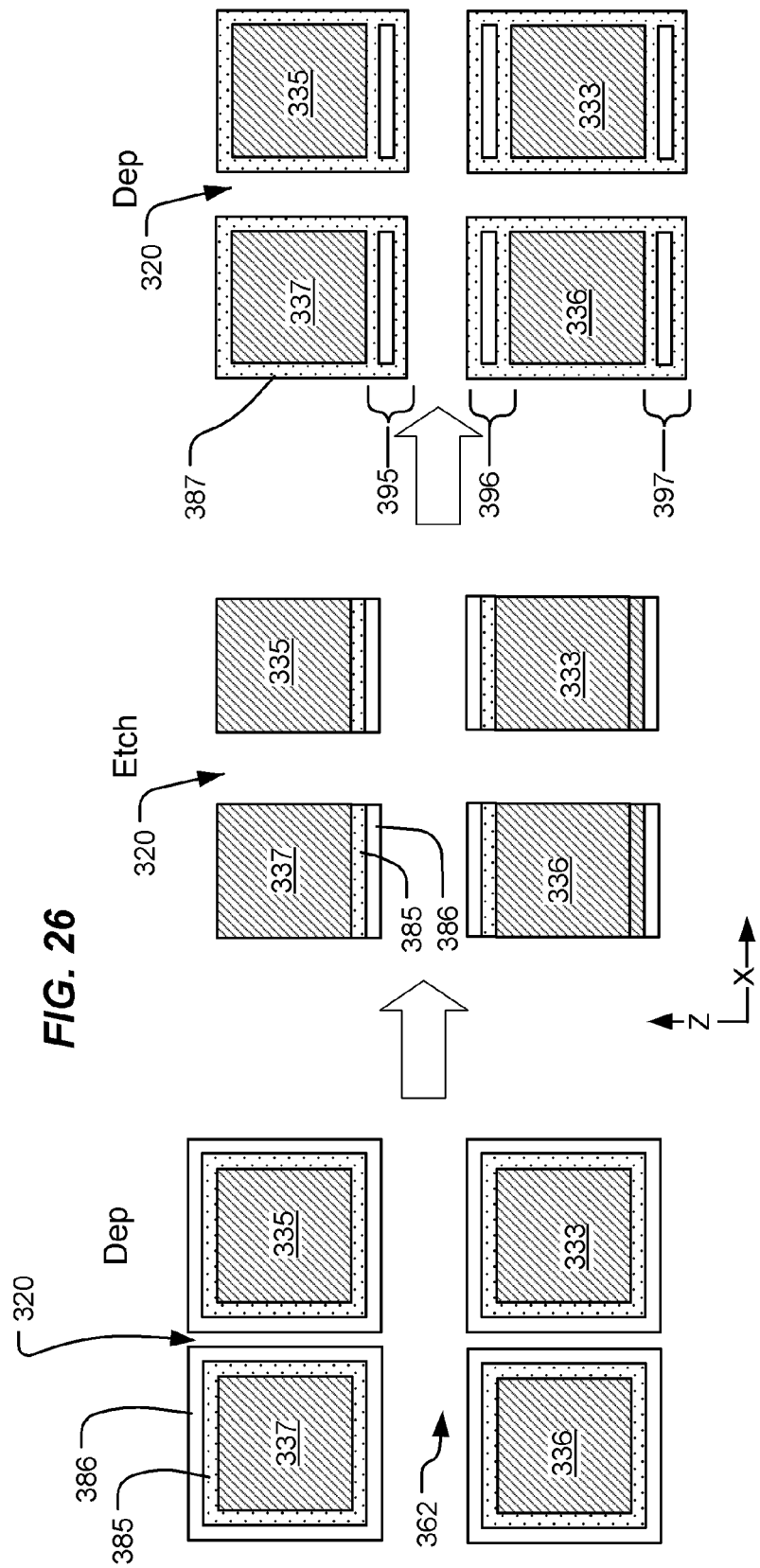
FIG. 26 illustrates a second process for forming memory elements on the suspended conductor lines of the structure like that of FIG. 24.

FIG. 26 illustrates (utilizing reference numbers from FIG. 23 for corresponding structures) another approach to formation of the memory elements. In embodiments like that shown in FIG. 26, wherein the memory elements comprise dielectric charge trapping memory elements including a blocking layer, a charge trapping layer and a tunneling layer, and wherein providing memory elements includes forming at least one of a layer of material of the blocking layer, a layer of material of the charge trapping layer and a layer of material of the tunneling layer after removing the sacrificial lines; applying anisotropic etching to remove the at least one layer from sides of the plurality of first type conductor lines; and forming at least one remaining layer of the blocking layer, the charge trapping layer and the tunneling layer, to complete the dielectric charge trapping memory elements on upper and lower surfaces of the first type conductor lines, before layering conductor material and insulating material within the trench structures. In the example shown in FIG. 26, a tunneling layer 385 and a charge trapping layer 386 of a memory structure are formed surrounding the suspended word lines 333, 335, 336, 337. Then anisotropic etching is applied, that removes the tunneling and charge trapping layers from the side surfaces of the suspended conductor lines 333, 335, 336, 337 and optionally from the top surfaces of the top conductor lines 335, 337. Next, a layer 387 of blocking dielectric, such as silicon dioxide formed using a thermal process, or other blocking dielectric material, is formed over the structure as illustrated. As a result, result, memory elements 395, 396, 397 are formed on the upper and lower surfaces of the suspended word lines 336, 333, and on the lower surfaces of the suspended word lines 337 and 335. The procedure FIG. 26 might be preferred when the width of the trench 320 between the self aligned stacks is relatively narrow compared to the thicknesses of the layers 385, 386, 387 used to form the memory elements 395, 396, 397.

Figure 27:
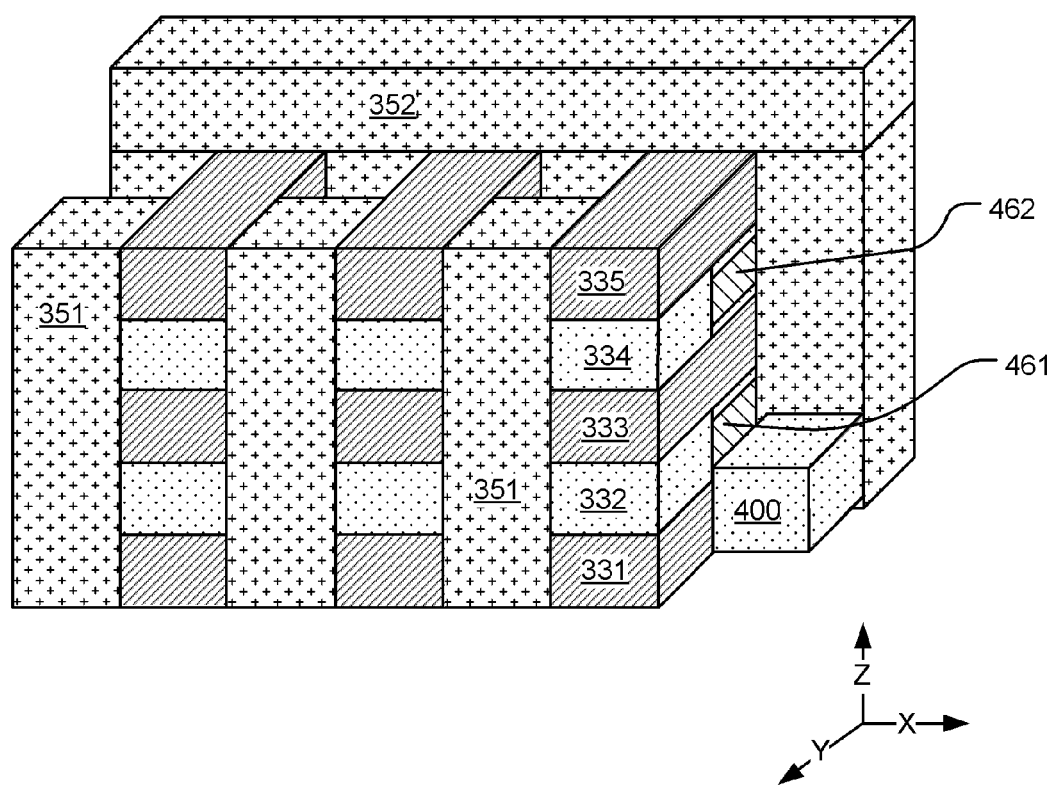
FIGS. 27 to 31 illustrate stages in a process for layering the self aligned bit lines within the trenches of the structure of FIG. 24 after formation of memory elements.

FIG. 27 provides a perspective like that of FIG. 24, and illustrates a stage in a layering process of forming self aligned bit lines within the trenches, after the formation of the memory elements using one of the processes of FIGS. 25 and 26 for example. As a first step in forming the self-aligned bit lines, conductive material is deposited to fill the voids (361, 362 in FIG. 24) between the word lines and the trenches. Then the conductive material is anisotropically etched back within the trenches while leaving the bodies 461, 462 of conductive bit line material between the word lines. The bodies 461, 462 comprise parts of the bit lines being formed formed. Then, the iterative deposit and etch back process is performed to connect the bit line portions together. FIG. 27 shows the results of depositing a dielectric layer 400 such as a silicon nitride which can be selectively etched relative to the material of the memory elements and material of the conductor lines. The deposited layer can be etched back to the level of the upper surface of a first conductor line 331 as shown. Voids 361, 362 left by the removal of the sacrificial material within the trenches between the suspended conductor lines 333 and 335 remain open after this step by using for example an isotropic etching back process to remove any material deposited inside the voids 361, 362.

Figure 28:
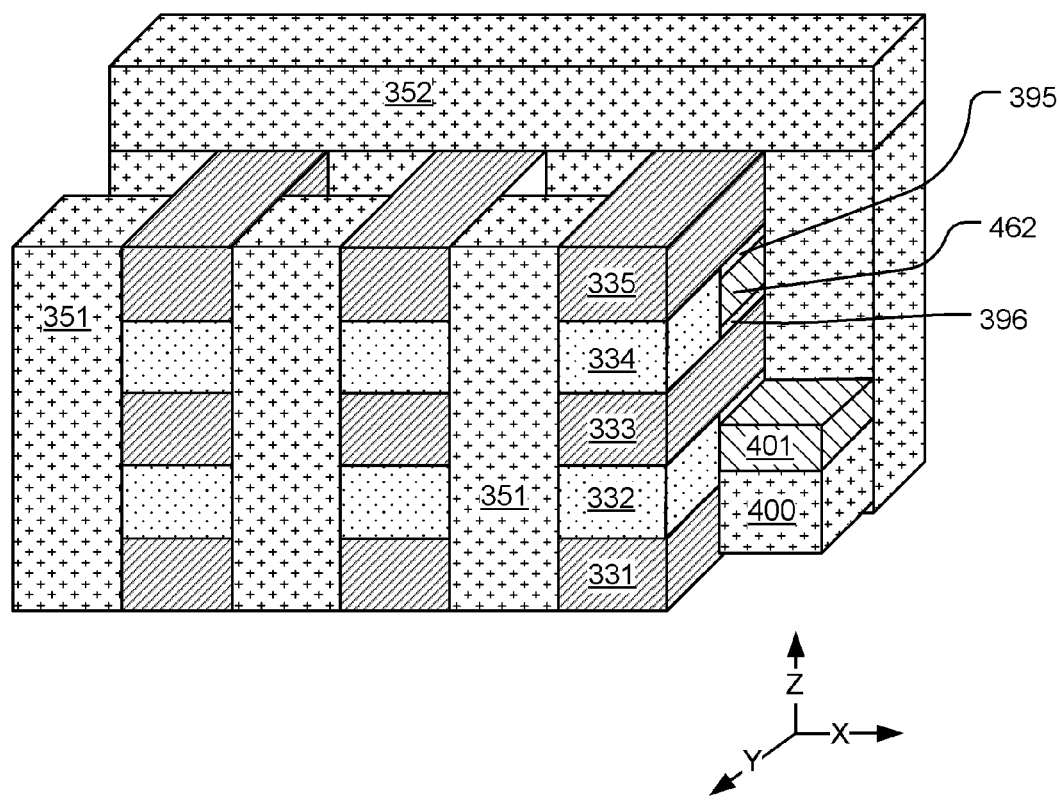

In FIG. 28, results are shown of a next layering step that includes depositing a metal, or other bit line material within the trenches and etching back, forming a first level 401 of damascene conductor lines extending through the word line stacks.

Figure 29:
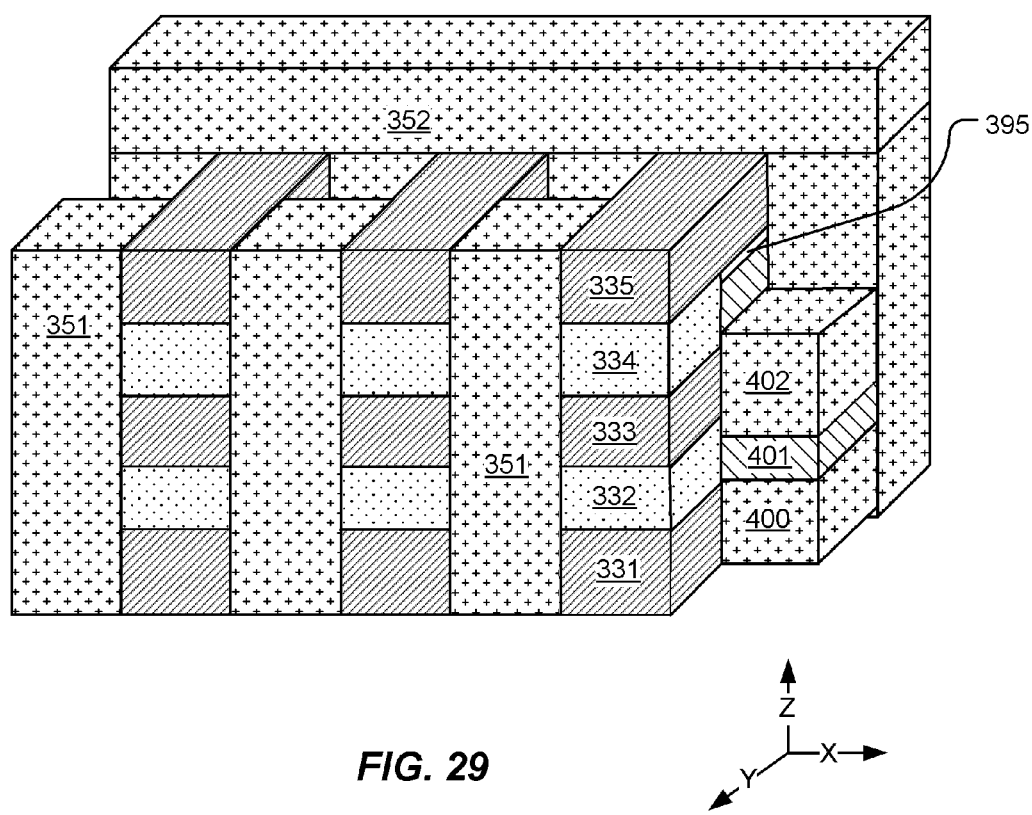

FIG. 29 illustrates results of a next layering process used to form a second layer 402 of insulating dielectric over the first level 401 of bit lines. The process can include depositing a dielectric which can be selectively etched as mentioned above, and etching back to a level just above the upper surface of conductor line 333.

Figure 30:
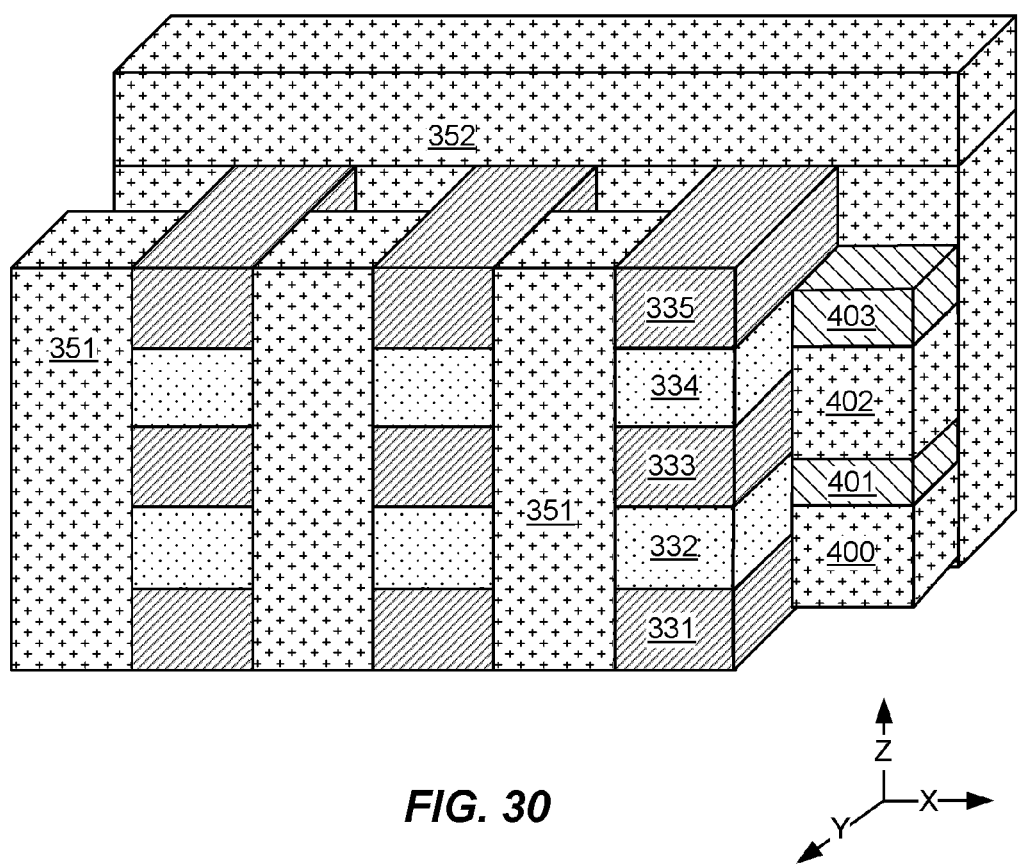

In FIG. 30 results are shown of a next layering process used for formation of a second level 403 of damascene bit lines, within the trenches.

Figure 31:
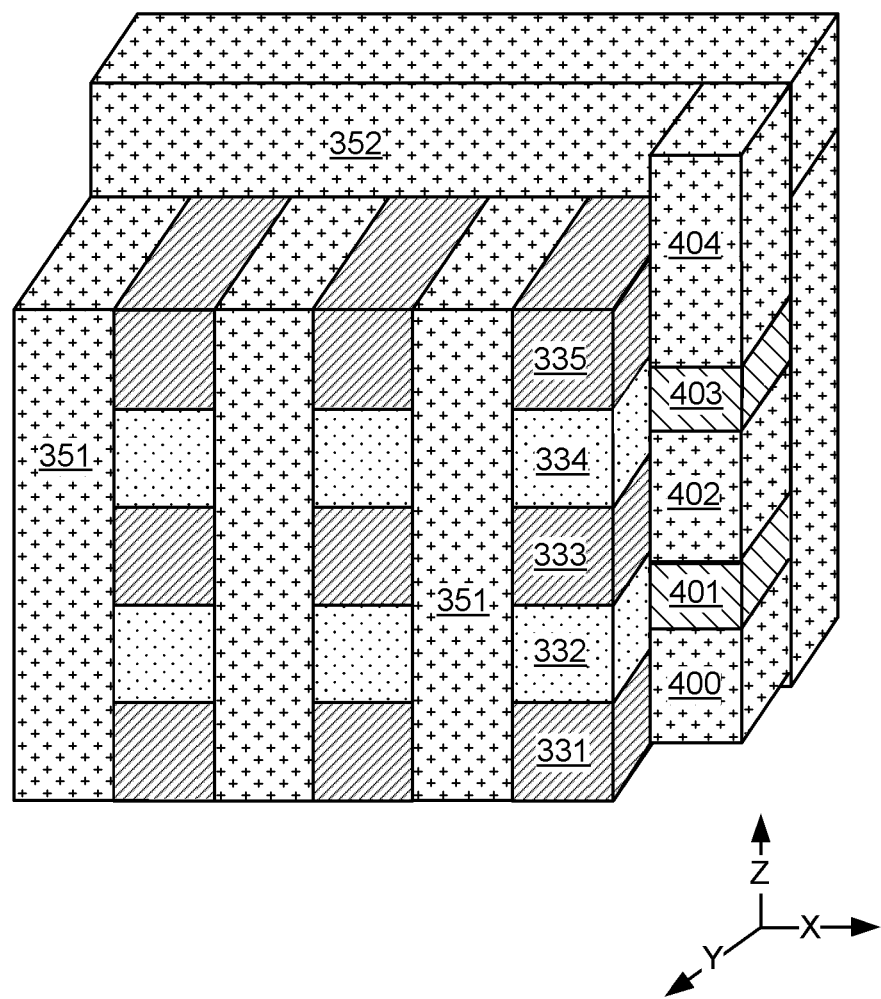

FIG. 31 shows the results of formation of a final layer 404 of insulating material, filling the trenches. As mentioned above, the crossbar element 351 on the front of the structure has been partially removed to reveal structure in the trenches more clearly for the purpose of this description. As a result of the processes described above, a plurality of self aligned word line stacks and a plurality of self aligned bit lines stacks are interleaved, with memory elements at the cross points.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device including a plurality of layers of memory cells, comprising:
    a first level including a plurality of first-type conductor lines which are symmetrical about respective primary axes and arranged generally in parallel;
    a second level over the first level, and including a plurality of second-type conductor lines arranged generally in parallel and orthogonal to the plurality of first-type conductor lines in the first level;
    a third level over the second level, and including a plurality of first-type conductor lines which are symmetrical about respective primary axes and arranged generally in parallel;
    a fourth level over the third level, and including a plurality of second-type conductor lines arranged generally in parallel and orthogonal to the plurality of first-type conductor lines in the first level;
    the primary axes of first-type conductor lines in the plurality of first-type conductor lines in the first level being aligned with the primary axes of corresponding first-type conductor lines in the plurality of first-type conductor lines in the third level;
    the primary axes of second-type conductor lines in the plurality of second-type conductor lines in the second level being aligned with the primary axes of corresponding second-type conductor lines in the plurality of second-type conductor lines in the fourth level;
    a first array of data storage structures at cross points between upper surfaces of the first-type conductor lines in the first level and lower surfaces of the second-type conductor lines in the second level;
    a second array of data storage structures at cross points between lower surfaces of the first-type conductor lines in the third level and upper surfaces of the second-type conductor lines in the second level; and
    a third array of data storage structures at cross points between upper surfaces of the first-type conductor lines in the third level and lower surfaces of the second-type conductor lines in the fourth level;
    wherein the first-type conductor lines act as one of word lines and bit lines, and the second-type conductor lines act as the other of word lines and bit lines, including:
    crossbar structures of fill material orthogonal to the plurality of first-type conductor lines in the first and third levels, the crossbar structures having vertical features of fill material between stacks in a plurality of self-aligned stacks of first-type conductor lines extending from a level of bit lines in a bottom layer to a level of first-type conductor lines in a top layer in the plurality of self-aligned stacks of first-type conductor lines, and including horizontal features of fill material between the first-type conductor lines in the stacks extending from a region between first-type conductor lines in one of the stacks to a region between first-type conductor lines in another of the stacks, leaving openings in the fill material through which the plurality of first-type conductor lines extend, and wherein the crossbar structures are disposed at spaced apart locations whereby there are regions between the crossbar structures across which the plurality of first-type conductor lines extend; and
    isolation material, different than said fill material, between the plurality of first-type conductor lines in said regions between the crossbar structures.

2. The integrated circuit device of claim 1, wherein the data storage structures comprise dielectric charge trapping structures.

3. The integrated circuit device of claim 1, the data storage structures in the first and second arrays comprise layers of memory material on the upper and lower surfaces of the second-type conductor lines in the second level.

4. The integrated circuit device of claim 1, wherein the first-type conductor lines in plurality of first-type conductor lines in the third level are self-aligned with corresponding first-type conductor lines in the plurality of first-type conductor lines in the first level.

5. The integrated circuit device of claim 1, including:
    a fifth level over the fourth level, and including plurality of first-type conductor lines which are symmetrical about respective primary axes and arranged generally in parallel; and
    the primary axes of first-type conductor lines in plurality of first-type conductor lines in the fifth level being aligned with the primary axes of corresponding first-type conductor lines in the plurality of first-type conductor lines in the third level; and
    a fourth array of data storage structures at cross points between lower surfaces of the first-type conductor lines in the fifth level and upper surfaces of the second-type conductor lines in the fourth level.

6. The integrated circuit device of claim 5, wherein the first-type conductor lines in plurality of first-type conductor lines in the fifth level are self-aligned with the corresponding first-type conductor lines in the plurality of first-type conductor lines in the first level.

7. The integrated circuit device of claim 5, wherein the data storage structures in the first array of data storage structures, in the second array of data storage structures, in the third array of data storage structures, and in the fourth array of data storage structures, are charge trapping layers on channel regions in the first-type conductor lines and the channel regions in the first-type conductor lines are isolated from the channel regions in adjacent first-type conductor lines.

8. The integrated circuit device of claim 1, wherein the data storage structures in the first array of data storage structures comprise a layer of aluminum oxide ($Al_2O_3$) over a layer of silicon nitride (SiN), the second-type conductor lines in the second level comprise a layer of tantalum nitride (TaN) over a layer of one of tungsten (W) and tungsten nitride (WN) over a second layer of tantalum nitride (TaN), and the data storage structures in the second array of data storage structures comprise a layer of silicon nitride (SiN) over a layer of aluminum oxide ($Al_2O_3$).

9. The integrated circuit device of claim 1, including a layer of silicon nitride beneath the plurality of first-type conductor lines, the layer including recesses between the lines in the plurality of first-type conductor lines.

10. The integrated circuit device of claim 1, wherein the data storage structures in the first array of data storage structures, in the second array of data storage structures, and in the third array of data storage structures, are charge trapping layers on channel regions in the first-type conductor lines and the channel regions in the first-type conductor lines are isolated from the channel regions in adjacent first-type conductor lines.

11. An integrated circuit device, comprising:
a plurality of self-aligned stacks of word lines orthogonal to and interleaved with a plurality of self-aligned stacks of bit lines; and
data storage structures at cross points between word lines and bit lines in the plurality of self-aligned stacks of word lines interleaved with the plurality of self-aligned stacks of bit lines, including:
crossbar structures of fill material orthogonal to self-aligned stacks of bit lines in the plurality of self-aligned stacks of bit lines, the crossbar structures having vertical features of fill material between the stacks in the plurality of self-aligned stacks of bit lines extending from a level of bit lines in a bottom layer to a level of bit lines in a top layer in the plurality of self-aligned stacks of bit lines, and including horizontal features of fill material between the bit lines in the stacks extending from a region between bit lines in one of the stacks to a region between bit lines in another of the stacks, leaving openings in the fill material through which the self-aligned stacks of bit lines extend, and wherein the crossbar structures are disposed at spaced apart locations whereby there are regions between the crossbar structures across which the self-aligned stacks of bit lines extend; and
isolation material, different than said fill material, between the bit lines in the self-aligned stacks of bit lines in said regions between the crossbar structures.

12. The integrated circuit device of claim 11, wherein the word lines in a given stack in the plurality of self-aligned stacks of word lines are symmetric about respective primary axes, and the primary axes of the word lines in the given stack are aligned; and
the bit lines in a given stack in the plurality of self-aligned stacks of bit lines are symmetric about respective primary axes, and the primary axes of the bit lines in the given stack are aligned.

13. The integrated circuit device of claim 11, wherein the data storage structures comprise dielectric charge trapping structures.

14. The integrated circuit device of claim 11, wherein the data storage structures at cross points include memory material on upper and lower surfaces of word lines in the plurality of self-aligned-stacks of word lines.

15. The integrated circuit device of claim 11, wherein the data storage structures are charge trapping layers on channel regions in the bit lines, and the channel regions in the bit lines are isolated from the channel regions in adjacent bit lines.

* * * * *